US009722590B1

(12) United States Patent
Usugi et al.

(10) Patent No.: US 9,722,590 B1
(45) Date of Patent: Aug. 1, 2017

(54) SKEW ADJUSTMENT CIRCUIT, SEMICONDUCTOR DEVICE, AND SKEW CALIBRATION METHOD

(71) Applicant: Hitachi, Ltd., Chiyoda-ku, Tokyo (JP)

(72) Inventors: Tatsunori Usugi, Tokyo (JP); Kouzaburou Kurita, Tokyo (JP); Takemasa Komori, Tokyo (JP); Junya Nasu, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 15/180,146

(22) Filed: Jun. 13, 2016

(30) Foreign Application Priority Data

Jan. 26, 2016 (JP) ................. 2016-012627

(51) Int. Cl.
- *H04L 7/00* (2006.01)
- *H03K 5/15* (2006.01)
- *H03L 7/08* (2006.01)
- *H04L 7/033* (2006.01)

(52) U.S. Cl.
CPC ....... *H03K 5/15066* (2013.01); *H03L 7/0807* (2013.01); *H04L 7/033* (2013.01)

(58) Field of Classification Search
CPC ....... H03L 7/0814; H03L 7/095; H03L 7/089; H03L 7/093; H03L 7/0992; H03L 7/0996; H03L 7/18; H04L 7/0337; H04L 2027/0059; H04L 2027/0067; H04L 25/0278; H04L 25/085; H04L 5/1423; H04L 7/0008

See application file for complete search history.

(56) References Cited

U.S. PATENT DOCUMENTS

| | | | | |
|---|---|---|---|---|
| 5,587,709 A | * | 12/1996 | Jeong | H03K 19/01859 341/100 |
| 6,680,874 B1 | * | 1/2004 | Harrison | G11C 8/18 327/156 |
| 7,003,066 B1 | * | 2/2006 | Davies | H03L 7/0814 375/374 |
| 7,183,821 B1 | * | 2/2007 | Chao | H03L 7/0812 327/149 |
| 8,023,605 B2 | | 9/2011 | Tsukamoto et al. | |

(Continued)

FOREIGN PATENT DOCUMENTS

JP         2008-66879 A         3/2008

*Primary Examiner* — Khanh C Tran

(74) *Attorney, Agent, or Firm* — Crowell & Moring LLP

(57) ABSTRACT

A skew adjustment circuit includes: flip flop circuits for taking in an input signal in response to first clock signals; a clock phase adjustment circuit for adjusting phases of second clock signals, based on the second clock signals generated based on a reference clock signal and an output signal from the flip flop circuits; a phase interval detection circuit for detecting a phase interval between the first clock signals, based on a reference value; and a phase interval adjustment circuit for performing adjustment such that phase intervals become equal to each other between the second clock signals adjusted by the clock phase adjustment circuit, based on a skew adjustment signal from the phase interval detection circuit. The reference value is obtained by calibration, and the second clock signals adjusted by the phase interval adjustment circuit are provided as the first clock signals to the flip flop circuits.

10 Claims, 11 Drawing Sheets

(56) References Cited

U.S. PATENT DOCUMENTS

| | | | |
|---|---|---|---|
| 2005/0265440 A1* | 12/2005 | Sohn | H03L 7/0814 |
| | | | 375/233 |
| 2006/0050827 A1* | 3/2006 | Saeki | H03M 9/00 |
| | | | 375/362 |
| 2006/0109942 A1* | 5/2006 | Vallet | H04L 7/0338 |
| | | | 375/355 |
| 2007/0197181 A1* | 8/2007 | Yang | H03L 7/0812 |
| | | | 455/260 |
| 2008/0174352 A1* | 7/2008 | Miyakoshi | H03K 5/01 |
| | | | 327/231 |

* cited by examiner

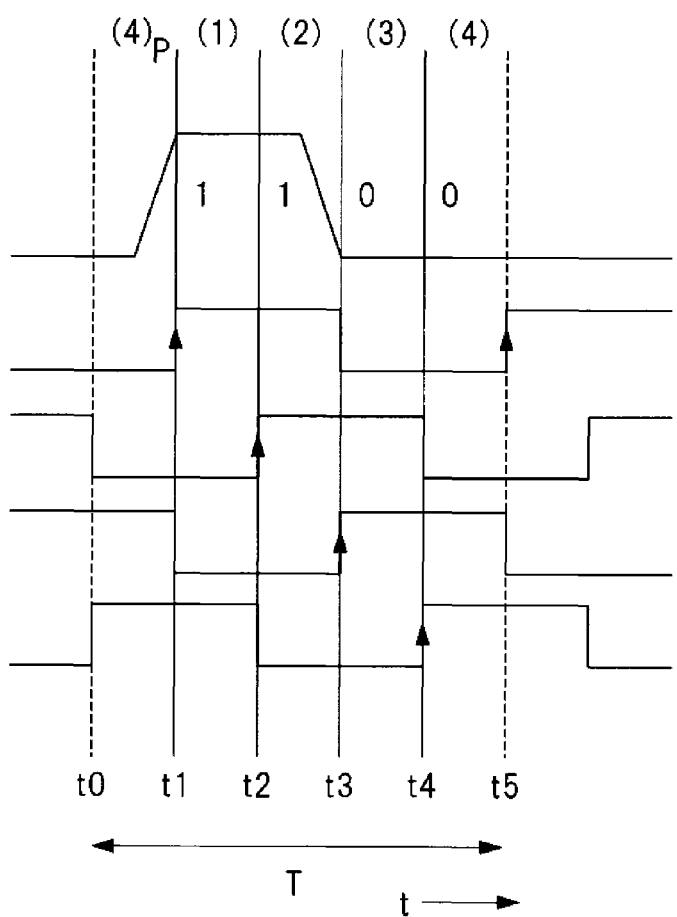
FIG. 10A In
FIG. 10B CL1-A
FIG. 10C CL2-A
FIG. 10D CL3-A
FIG. 10E CL4-A

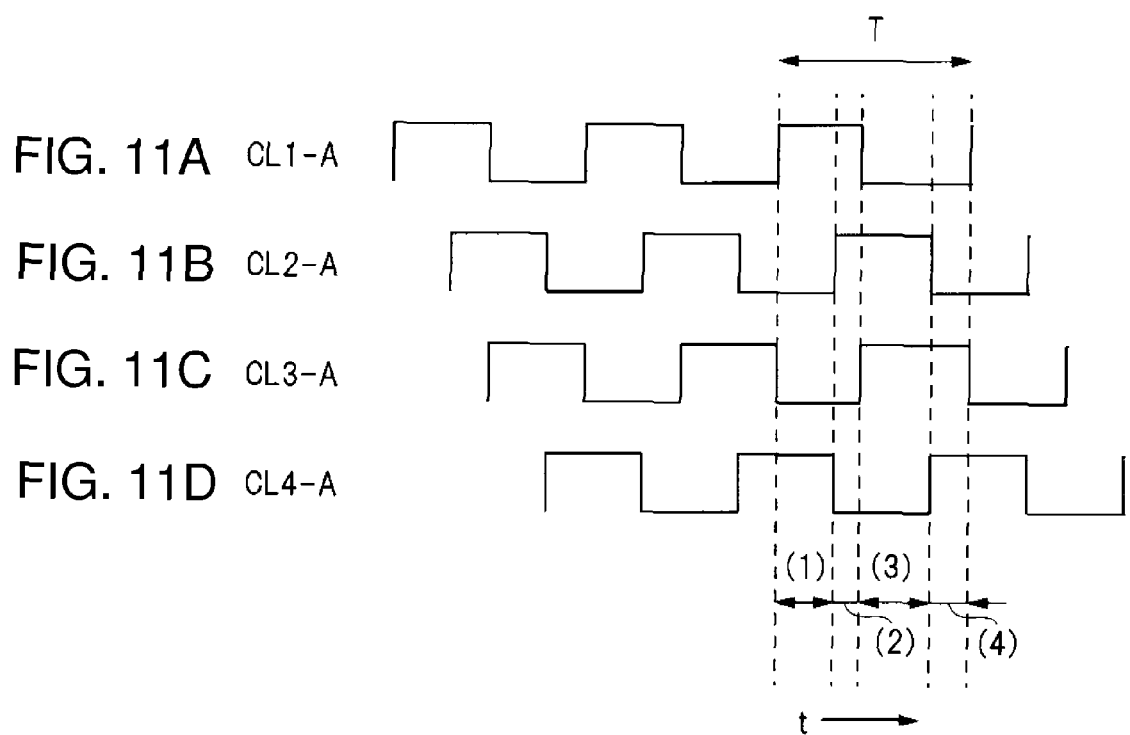

SKEW ADJUSTMENT CIRCUIT, SEMICONDUCTOR DEVICE, AND SKEW CALIBRATION METHOD

BACKGROUND OF THE INVENTION

1. Field of the Invention

The present invention relates to a skew adjustment circuit, a semiconductor device, and a skew calibration method, and in particular relates to the skew adjustment circuit of a clock signal used in a Clock and Data Recovery circuit (hereinafter referred to as a CDR circuit), and the semiconductor device including the CDR circuit.

2. Description of the Related Art

Along with speeding up of information communication apparatuses, a transfer rate of data (data rate) has been increased for transferring the data between semiconductor devices configuring the information communication apparatuses. For example, it is expected that the transfer rate per channel to transfer the data reaches 25 Gbps in 2016 and the transfer rate is further increased. The semiconductor devices are mounted on a circuit board such as a printed circuit board, and transmission and reception of the data are performed via wiring of the circuit board. In that case, the wiring of the circuit board functions as a transmission line for transferring the data; however, there is a transmission loss in the transmission line, and the transmission loss is increased according to an increase in the transfer rate of the data transmitted through the transmission line.

When the data of high transfer rate is attempted to be transferred by using the transmission line, due to the transmission loss in the transmission line and reflection, intersymbol interference is generated and a signal waveform is degraded. In particular, when the transmission line has a long distance, degradation of the signal waveform is increased, and transferring the data of high transfer rate becomes difficult.

As a semiconductor device for improving the degradation of the signal waveform, for example, there is a semiconductor device having a function of a signal conditioner. Such a semiconductor device includes, for example, an equalizer, and improvement of the waveform degradation is achieved by the equalizer. To improve the waveform degradation by the equalizer, it is required to convert the waveform transmitted through the transmission line into a digital signal. In serial communication, the data to be transferred and a synchronous clock signal for identifying the data are superimposed on each other to be transferred as an input signal.

The semiconductor device having the function of the signal conditioner includes a CDR circuit, and extracts the data (digital signal) from the input signal by the CDR circuit. The data extracted is provided to the equalizer, and the improvement of the waveform degradation is performed.

A technique relating to the CDR circuit is described in, for example, JP-2008-66879-A.

SUMMARY OF THE INVENTION

In the CDR circuit, sampling of the input signal is performed at a plurality of clock signals having different phases from each other, and the data transmitted (digital signal) is extracted from values obtained by sampling. In that case, the plurality of clock signals having different phases from each other is formed based on, for example, one reference clock signal.

Due to the fact that the transfer rate is increased, a period of the data to be transmitted is shortened. Therefore, it is also required to shorten a period of the clock signal for sampling the input signal. When variation is generated in phase intervals between the clock signals for sampling due to variation during manufacturing of a semiconductor device having the CDR circuit and environmental change such as temperature change of when the semiconductor device is used, it becomes difficult to sample the input signal at an appropriate timing, and it leads to erroneous operation. Therefore, it is required to prevent that variation is generated in the phase intervals between the clock signals for sampling.

In JP-2008-66879-A, a technique is described relating to the CDR circuit. In JP-2008-66879-A, it is stated that reducing the variation of the phase intervals between the clock signals is difficult when the plurality of clock signals is formed using one reference clock signal.

An object of the present invention is to provide a skew adjustment circuit capable of achieving reduction of the erroneous operation, and a semiconductor device incorporating a CDR circuit capable of achieving the reduction of the erroneous operation.

The object and other objects and novel features of the present invention will be apparent from the description of the present specification and accompanying drawings.

A summary of typical ones of the inventions disclosed in the present application is briefly described as follows.

In an embodiment, a skew adjustment circuit includes: a plurality of latch circuits for taking in an input signal in response to the plurality of first clock signals; a phase adjustment circuit for adjusting phases of a plurality of second clock signals, based on the plurality of second clock signals generated based on a reference clock signal and output signals from the plurality of latch circuits; a phase interval detection circuit for detecting phase intervals between the plurality of first clock signals, based on a reference value; and a phase interval adjustment circuit for performing adjustment such that phase intervals become equal to each other between the plurality of second clock signals adjusted by the phase adjustment circuit, based on a skew adjustment signal from the phase interval detection circuit. Here, the reference value is obtained by calibration, and the plurality of second clock signals adjusted by the phase interval adjustment circuit is provided as the plurality of first clock signals to the plurality of latch circuits. The phase intervals are determined to be equal to each other between the plurality of first clock signals for determining timing when each of the latch circuits takes in the input signal, based on the reference value obtained by the calibration. Thus, it becomes possible to suppress that timing when each of the latch circuits takes in the input signal varies, and reduction of erroneous operation can be achieved.

In addition, in an embodiment, a semiconductor device includes: a plurality of latch circuits for taking in an input signal in response to a plurality of first clock signals having different phases from each other; a CDR circuit for receiving output signals from the plurality of latch circuits to form a plurality of second clock signals having different phases from each other, from the plurality of output signals received; a phase interval detection circuit for detecting a phase interval between the plurality of first clock signals, based on a reference value; and a phase interval adjustment circuit for performing adjustment such that phase intervals become equal to each other between the plurality of second clock signals formed by the CDR circuit, based on a skew adjustment signal from the phase interval detection circuit. The reference value is obtained by calibration, and the plurality of second clock signals adjusted by the phase interval adjustment circuit is provided as the plurality of first clock signals to the plurality of latch circuits.

Further, in an embodiment, a skew calibration method is provided for correcting a skew between a plurality of clock signals having different phases from each other. The provided skew calibration method includes: a phase interval detection process for obtaining a time difference (phase interval) between the clock signals being close to each other, in the plurality of clock signals formed based on a reference clock signal; and an operation process for obtaining a total of the time difference obtained in the phase interval detection process for the plurality of clock signals and for obtaining the reference value by dividing the obtained total by the number of the plurality of clock signals, and phases of the clock signals are adjusted (corrected) by the reference value obtained in the operation process. In the plurality of clock signals formed based on the reference clock signal, the total of the time difference between the clock signals being close to each other corresponds to one period of the reference clock signal. Therefore, even when the phase intervals vary between particular clock signals, total time does not vary. Therefore, the reference value that is not affected by variation can be obtained by dividing the total time by the number of the clock signals formed. Since the phases of the clock signals are corrected using the reference value that is not affected by the variation, reduction of erroneous operation can be achieved.

An advantageous effect obtained by the typical ones of the inventions disclosed in the present application is simply described as follows.

The skew adjustment circuit capable of achieving reduction of erroneous operation, and the semiconductor device incorporating the CDR circuit capable of achieving reduction of erroneous operation can be provided.

BRIEF DESCRIPTION OF THE DRAWINGS

FIGS. 10A-10E are waveform diagrams illustrating waveforms of the CDR circuit; and FIGS. 11A-11D are waveform diagrams illustrating waveforms in a case of having skew.

DESCRIPTION OF THE PREFERRED EMBODIMENTS

Figure 1:
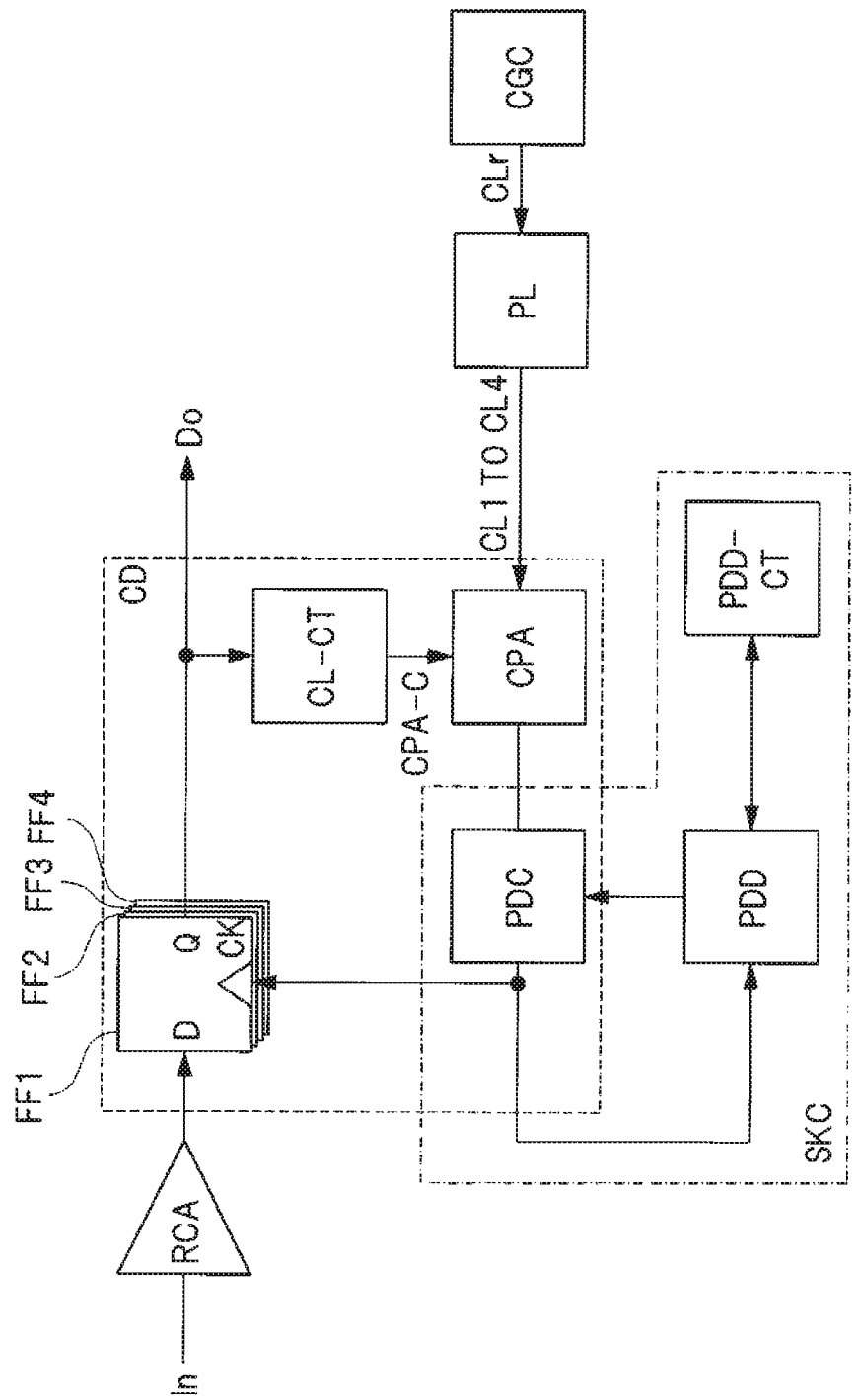
FIG. 1 is a block diagram illustrating an overall configuration of a skew adjustment circuit according to a first embodiment.

Hereinafter, embodiments of the present invention are described in detail with reference to the drawings. Incidentally, in all the drawings for describing the embodiments, the same portions are denoted by the same reference numeral in principle, and repetitive description thereof is omitted in principle.

First Embodiment

<Configuration of Electronic Apparatus>

Figure 8:
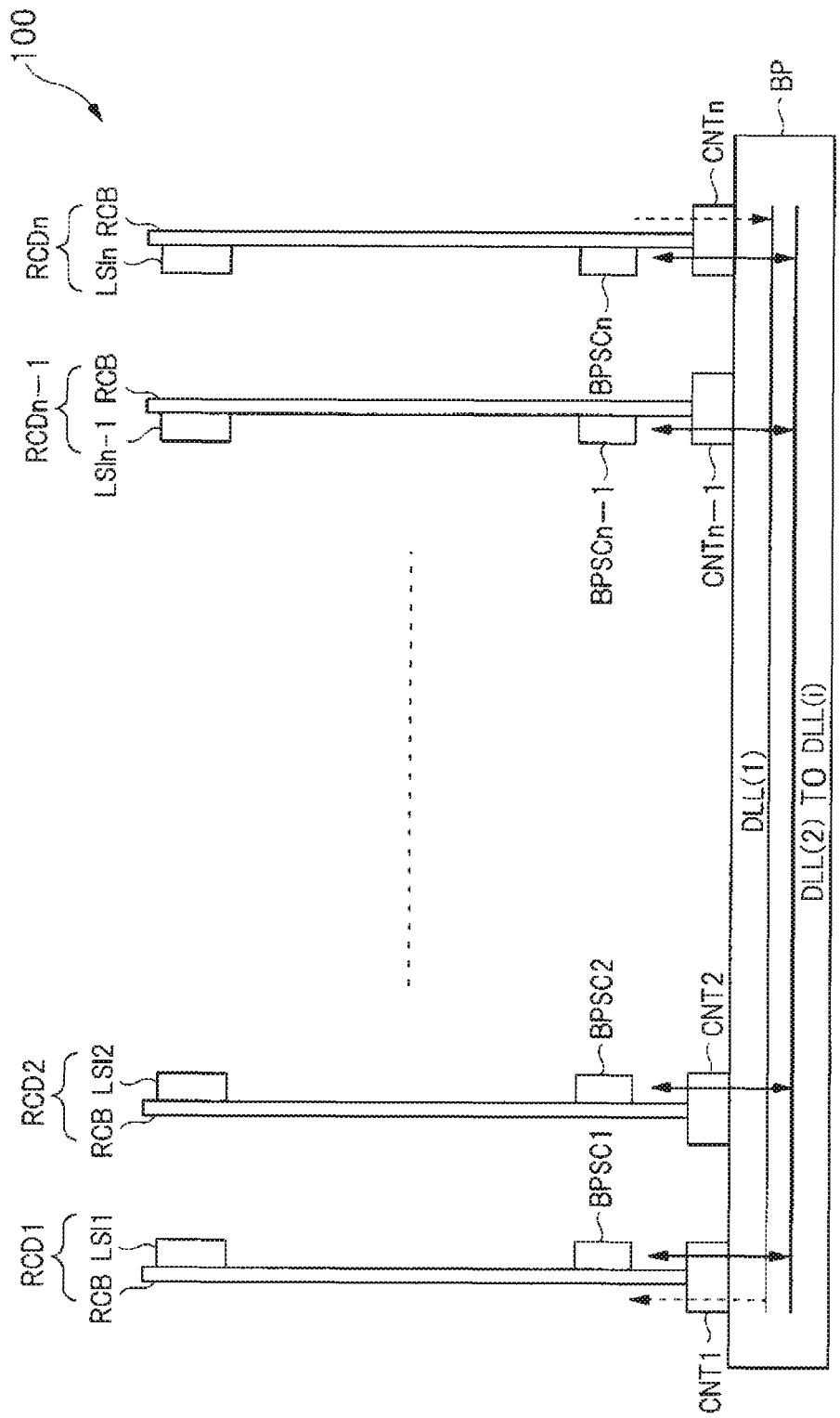
FIG. 8 is a schematic sectional view illustrating a configuration of an electronic apparatus using a semiconductor device according to the first embodiment.

FIG. 8 is a schematic sectional view illustrating a configuration of an electronic apparatus using a semiconductor device according to a first embodiment. In FIG. 8, an information communication apparatus 100 is an electronic apparatus. The information communication apparatus 100, although it is not particularly limited, includes a back plane BP on which a plurality of connectors CNT1-CNTn is mounted, and cards RCD1-RCDn attached to the connectors CNT1-CNTn.

In the back plane BP, multiple wirings are formed for electrically connecting the connectors CNT1-CNTn to each other, and the wirings become transmission lines when data are transmitted between the connectors CNT1-CNTn. In FIG. 8, the transmission lines configured by the wirings formed on the back plane BP are illustrated as DLL(1)-DLL (i). In addition, for convenience of description, the transmission line used for data transmission between the connector CNT1 and the connector CNTn is illustrated as the DLL(1), and the rest of the transmission lines DLL(2)-DLL (i) are illustrated by one thick solid line.

Each of the cards RCD1-RCDn includes a circuit board RCB and multiple semiconductor devices and electronic devices mounted on the circuit board RCB, and the multiple semiconductor devices and electronic devices or/and the multiple semiconductor devices (including electronic devices) and connectors are electrically connected to each other by wiring formed on the circuit board RCB. A part of the wirings formed on the circuit board RCB, since it is also used in the data transmission, functions as the transmission line. In FIG. 8, as an example, the cards RCD1, RCD2, RCDn-1 and RCDn of the cards RCD1-RCDn are illustrated.

On the cards RCD1, multiple semiconductor devices are mounted; however, in FIG. 8, only two semiconductor devices LSI1, BPSC1 of those semiconductor devices are illustrated. Here, the semiconductor device BPSC1 is a semiconductor device having a function of a signal conditioner. The function of the signal conditioner is a function for equalizing degradation of the data generated by intersymbol interference generated by those transmission lines and the like, and providing the data restored by equalization to the semiconductor device LSI1 and the like, when data is provided via the transmission lines DLL(1)-DLL(i) configured by the wirings formed on the circuit board PCB and the like. On each of the cards RCD2, RCDn-1 and RCDn, similarly to the card RCD1, multiple semiconductor devices are mounted. When the card RCD2 is viewed, of the multiple semiconductor devices mounted, the semiconductor device LSI2 and the semiconductor device BPSC2 having the function of the signal conditioner are illustrated, and when the card RCDn-1 is viewed, of the multiple semiconductor devices mounted, the semiconductor device LSIn-1 and the semiconductor device BPSCn-1 having the function of the signal conditioner are illustrated. Similarly, when the card RCDn is viewed, of the multiple semiconductor devices mounted, the semiconductor device LSIn and the semiconductor device BPSCn having the function of the signal conditioner are illustrated. The function of the signal conditioner included in each of the semiconductor devices BPSC2, BPSCn-1 and BPSCn is the same as the function of the signal conditioner included in the semiconductor device BPSC1.

Serial data is provided via the connectors CNTn from the cards RCDn to the transmission line DLL(1) illustrated in FIG. 8, for example, as illustrated by the dashed arrow. The serial data is transmitted through the transmission line DLL(1), and the data transmitted is provided to the semiconductor device BPSC1 mounted on the card RCD1 via the connectors CNT1 as illustrated by the dashed arrow. The data restored in the semiconductor device BPSC1 is provided to the semiconductor device (for example, LSI1) mounted on the card RCD1, and processed in the semiconductor device LSI1. Incidentally, the serial data provided to the transmission line DLL(1) from the card RCDn is formed by, for example, the semiconductor device LSIn. Of course, a devise for forming the serial data is not limited to the semiconductor device, and can be, for example, an optical module mounted on the card RCDn and the like.

<Principle of CDR Circuit>

The semiconductor device having the function of the signal conditioner (for example, semiconductor device BPSC1 illustrated in FIG. 8) includes a CDR circuit for receiving the serial data (input signal) from the transmission line DLL(1), and an equalizer to which data extracted by the CDR circuit is provided.

Figure 9:
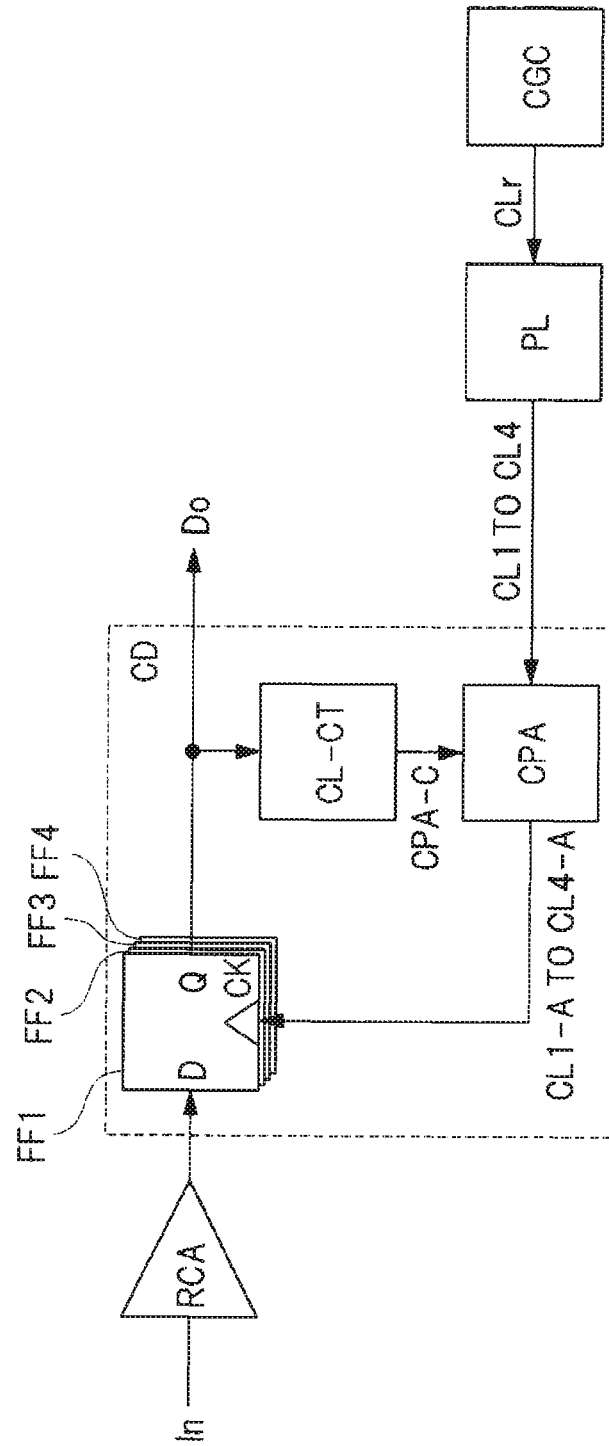
FIG. 9 is a block diagram illustrating a configuration of a CDR circuit.

First, the principle of the CDR circuit is described. FIG. 9 is a block diagram illustrating a configuration of the CDR circuit. In FIG. 9, a block CD illustrated by the dashed line is the CDR circuit. An input signal In transmitted through the transmission line (for example, DLL(1)) is provided to a receiver amplifier RCA. The receiver amplifier RCA amplifies the input signal In to provide to the CDR circuit CD.

In FIG. 9, a reference clock signal formation circuit CGC for forming a single phase of reference clock signal CLr is illustrated. Although it is not particularly limited, the reference clock signal formation circuit CGC forms the single phase of reference clock signal CLr of 156.25 MHz. The reference clock signal CLr is provided to a PLL (Phase Locked Loop) circuit PL. The PLL circuit PL multiplies the reference clock signal CLr to form multiple phases of clock signals. In the example illustrated in FIG. 9, four phases of clock signals CL1-CL4 are formed by the PLL circuit PL. Each of the four phases of clock signals CL1-CL4 has a frequency obtained by multiplying the reference clock signal CLr. The PLL circuit PL forms the four phases of clock signals from the reference clock signal CLr, so that the PLL circuit PL can be regarded as a multi-phase clock signal generation circuit.

The PLL circuit PL divides one period of a multiplied clock signal obtained by multiplication into four phase periods (first-fourth phase periods), and forms the clock signals CL1-CL4 so that each one period of the clock signals CL1-CL4 starts in each of the phase periods. For example, the PLL circuit PL forms the clock signal CL1 so that one period of the clock signal CL1 starts synchronizing with rise of the multiplied clock signal. Next, the PLL circuit PL forms the clock signal CL2 so that one period of the clock signal CL2 starts at timing when the first phase period elapses, and further, forms the clock signal CL3 so that one period of the clock signal CL3 starts at timing when the second phase period elapses. After that, the PLL circuit PL forms the clock signal CL4 so that one period of the clock signal CL4 starts at timing when the third phase period elapses. The PLL circuit PL forms the clock signal CL1 so that one period of the clock signal CL1 starts at timing when the last fourth phase period elapses. The above is repeated, and the four phases of clock signals CL1-CL4 are formed.

When a start of each one period of the clock signals CL1-CL4 is regarded as the rise of the clock signal, the clock signal CL1 rises, and then the clock signal CL2 rises at the timing when the first phase period elapses, and further, the clock signal CL3 rises at the timing when the second phase period elapses. After that, the clock signal CL4 rises at the timing when the third phase period elapses, and further, the clock signal CL1 rises at the timing when the fourth phase period elapses. That is, the clock signals CL1-CL4 are formed whose phases are shifted by the phase period to each other. When the clock signals are viewed whose rise timing are temporally close to each other, for example, the clock signals CL1 and CL2, CL2 and CL3, CL3 and CL4, CL4 and CL1, the phase period can be regarded as a phase interval between the clock signals being close to each other.

Thus, the four phases of clock signals CL1-CL4 formed by the PLL circuit PL are provided to the CDR circuit CD. In FIG. 9, the PLL circuit PL and the reference clock signal formation circuit CGC are illustrated separately from the CDR circuit CD; however, the CDR circuit CD can include the PLL circuit PL and the reference clock signal formation circuit CGC illustrated in FIG. 9.

The CDR circuit CD includes four flip flop circuits (also referred to as latch circuits) FF1-FF4, a clock control circuit CL-CT, and a clock phase adjustment circuit (also referred to as phase adjustment circuit) CPA. The flip flop circuits FF1-FF4 have the same configuration with each other. In FIG. 9, only the flip flop circuit FF1 is illustrated in detail, so that the flip flop circuit FF1 is described as an example. The flip flop circuit FF1 includes an input terminal D, an output terminal Q, and a clock input terminal CK, and, when a signal provided to the clock input terminal CK is changed, for example, from a low level to a high level, takes in a signal (data) provided to the input terminal D synchronizing with the change to hold the data. In addition, the data held is output from the output terminal Q.

An output signal from the receiver amplifier RCA is commonly provided to each input terminal D of the flip flop circuits FF1-FF4. The clock signals CL1-A-CL4-A from the clock phase adjustment circuit CPA are provided to each clock input terminal CK of the flip flop circuits FF1-FF4. For example, the clock signal CL1-A is provided to the clock input terminal CK of the flip flop circuit FF1, and the clock signal CL2-A is provided to the clock input terminal CK of the flip flop circuit FF2. Similarly, the clock signal CL3-A is provide to the clock input terminal CK of the flip flop circuit FF3, and the clock signal CL4-A is provided to the clock input terminal CK of the flip flop circuit FF4.

The flip flop circuits FF1-FF4, due to the fact that the clock signals CL1-A-CL4-A provided to the clock input terminals CK is changed from the low level to the high level, at that time, take in the input signal In provided to the input terminals D to store and output the signal. For example, at timing when the clock signal CL1-A is changed from the low level to the high level, the flip flop circuit FF1 takes in the input signal In provided to the input terminal D at the timing to hold and output the signal. In addition, at timing when the clock signal CL2-A is changed from the low level to the high level, the flip flop circuit FF2 takes in the input signal In provided to the input terminal D at the timing to hold and output the signal. The rest of the flip flop circuits FF3 and FF4, similarly, at the timing when the clock signals CL3-A, CL4-A are changed to the high level, take in the input signal In to output the signal.

The clock control circuit CL-CT forms a control signal CPA-C based on output signals of the flip flop circuits FF1-FF4. The clock phase adjustment circuit CPA, based on the control signal CPA-C, adjusts each phase of the multiple phases of clock signals CL1-CL4 provided from the PLL circuit PL, and outputs the multiple phases of clock signals obtained by adjustment as clock signals CL1-A-CL4-A.

Next, adjustment of the phase by the clock control circuit CL-CT and the clock phase adjustment circuit CPA is described with reference to FIGS. 10A-10E. FIGS. 10A-10E are waveform diagrams illustrating waveforms of the CDR circuit CD. In FIGS. 10A-10E, the horizontal axis indicates time t, and the vertical axis indicates voltage.

Here, FIG. 10A illustrates a waveform of the input signal In. In addition, FIGS. 10B-10E illustrate waveforms of the multiple phases of clock signals CL1-A-CL4-A provided to the clock input terminals CK of the flip flop circuits FF1-FF4. The multiple phases of clock signals CL1-A-CL4-A are formed by the clock phase adjustment circuit CPA, based on the control signal CPA-C and the multiple phases of clock signals CL1-CL4 formed by the PLL circuit PL. Here, the clock signal CL1-A formed by the clock phase adjustment circuit CPA corresponds to the clock signal CL1; the clock signal CL2-A corresponds to the clock signal CL2; the clock signal CL3-A corresponds to the clock signal CL3; the clock signal CL4-A corresponds to the clock signal CL4.

The PLL circuit PL, as described above, forms the four phases of clock signals CL1-CL4 based on the reference clock signal CLr. In the FIGS. 10A-10E, the phase periods (phase intervals) (1)-(4) described above are indicated. In addition, in FIGS. 10A-10E, a phase period (4)p indicates a phase period (4) in a previous cycle of the phase period (1).

In the CDR circuit CD, as illustrated in FIG. 10B, the clock signal CL1-A rises to the high level synchronizing with rise of the input signal In. The clock signal CL2-A rises to the high level at the timing when the phase interval (1) elapses. After that, the clock signal CL3-A rises to the high level at the timing when the phase interval (2) elapses, and the clock signal CL4-A rises to the high level at the timing when the phase interval (3) elapses. At the timing when the phase interval (4) elapses, the clock signal CL1-A rises from the low level to the high level again. The above is repeated, and the four phases of clock signals CL1-A-CL4-A based on the reference clock signal CLr are formed. Incidentally, each one period of the clock signals CL1-A-CL4-A is a total of the phase intervals (1)-(4).

As an example, a case is described in which the input signal In is changed in accordance with transmission data, as illustrated in FIG. 10A. Here, as an example, a case is illustrated in which serial data of two bits (logical value) is provided as the input signal In in the period of one period of the clock signal CL1. That is, in FIGS. 10A-10E, first bit data is provided as the input signal In between time t2 and t3, and second bit data is provided as the input signal In between next time t4 and t5. In FIGS. 10A-10E, change of the input signal In is illustrated in a case in which the first bit data is logical value "1," and the second bit data is logical value "0," and the input signal In is the high level for a predetermined time, and then is changed to the low level.

The clock phase adjustment circuit CPA, based on the control signal CPA-C, adjusts the phases of the clock signals CL1-CL4, and outputs the clock signals adjusted as the clock signals CL1-A-CL4-A. Here, the clock signal CL1-A indicates a clock signal obtained by adjusting the clock signal CL1, and the clock signal CL2-A indicates a clock signal obtained by adjusting the clock signal CL2. Similarly, the clock signal CL3-A indicates a clock signal obtained by adjusting the clock signal CL3, and the clock signal CL4-A indicates a clock signal obtained by adjusting the clock signal CL4.

<<Phase Adjustment>>

First, a case is described in which the phases of the clock signals CL1-CL4 are adjusted by the clock control circuit CL-CT and the clock phase adjustment circuit CPA, and of being operated by clock signals CL1-A-CL4-A of appropriate phases.

As illustrated in FIG. 10B, due to the fact that the clock signal CL1-A rises at time t1, the flip flop circuit FF1 takes in the high level (logical value "1") of the input signal In provided to the input terminal D at the time to hold and output the signal. When the phase interval (1) elapses and it is the time t2 as illustrated in FIG. 10C, the clock signal CL2-A rises. In response to the rise of the clock signal CL2, the flip flop circuit FF2 takes in the high level (logical value "1") provided to the input terminal D to hold and output the value. Similarly, as illustrated in FIG. 10D, when it is the time t3, the clock signal CL3-A rises. Thus, the flip flop circuit FF3 takes in the low level (logical value "0") provided to the input terminal D to hold and output the value. In addition, as illustrated in FIG. 10E, when it is the time t4, the clock signal CL4-A rises. Thus, the flip flop circuit FF4 takes in the low level (logical value "0") provided to the input terminal D to hold and output the value.

In that case, logical values output from the output terminal Q of the flip flop circuits FF2 and FF4 are provided to the equalizer as output signals Do of the CDR circuit CD.

The clock control circuit CL-CT forms the control signal CPA-C using the logical value output from each of the flip flop circuits FF1-FF4, and adjusts the phases of the clock signals CL1-CL4 in the clock phase adjustment circuit CPA.

The clock control circuit CL-CT, first, determines whether or not logical values match output from the flip flop circuit FF2 and the flip flop circuit FF4 with each other. That is, the clock control circuit CL-CT determines whether or not the logical value of the input signal In at the time t2 and the logical value of the input signal In at the time t4 match with each other. Here, when it is determined that the logical values match, it is regarded that there is no edge in which the value of the input signal In is changed between the time t2 and the time t4. On the other hand, it is determined that the logical values do not match, it is regarded that there is an edge in which the value of the input signal In is changed between the time t2 and the time t4. When there is the edge in which the value of the input signal In is changed, phases can be compared, so that the clock control circuit CL-CT executes phase comparison operation described later. On the other hand, when there is no edge, the clock control circuit CL-CT does not execute the phase comparison operation.

In the phase comparison operation, comparison is performed between the logical value output from the flip flop circuit FF3 and the logical value output from each of the flip flop circuits FF2 and FF4, and the clock phase adjustment circuit CPA is controlled by the control signal CPA-C so that each phase of the clock signals CL1-CL4 is advanced or delayed depending on a result of the comparison. First, the logical value from the flip flop circuit FF3 and the logical value from the flip flop circuit FF4 are compared with each other. That is, the logical value in the phase interval (3) and the logical value in the phase interval (4) are compared with each other. When the logical values in the phase intervals (3)

and (4) match with each other, it is determined that the phases (rise timings) of the clock signals CL1-CL4 are delayed, and the clock control circuit CL-CT forms the control signal CPA-C to advance the phases of the clock signals CL1-CL4.

Next, the logical value from the flip flop circuit FF3 and the logical value from the flip flop circuit FF2 are compared with each other. That is, the logical value in the phase interval (3) and the logical value in the phase interval (2) are compared with each other. When the logical values of the phase intervals (3) and (2) match with each other, it is determined that the phases (rise timings) of the clock signals CL1-CL4 are advanced, and the clock control circuit CL-CT forms the control signal CPA-C to delay the phases of the clock signals CL1-CL4.

The clock phase adjustment circuit CPA, when the control signal CPA-C for delaying the phases is provided, delays the phases of the clock signals CL1-CL4 to output the signal as the clock signals CL1-A-CL4-A. In addition, when the control signal CPA-C for advancing the phases is provided, the clock phase adjustment circuit CPA advances the phases of the clock signals CL1-CL4 to output the signal as the clock signals CL1-A-CL4-A.

In a state of the optimal phases, the control signal CPA-C for delaying the phases and the control signal CPA-C for advancing the phases are alternately provided to the clock phase adjustment circuit CPA from the clock control circuit CL-CT. That is, the clock phase adjustment circuit CPA alternately outputs the clock signals CL1-A-CL4-A obtained by delaying the phases of the clock signals CL1-CL4 and the clock signals CL1-A-CL4-A obtained by advancing the phases of the clock signals CL1-CL4.

Description has been made for the second bit data; however, it is the same for the first bit data. For the first bit data, the logical values of the flip flop circuits FF2 and FF4 are compared with each other. However, in that case, the logical value of the flip flop circuit FF4 is a value at time t0 in the previous cycle. That is, the logical value from the flip flop circuit FF4 in the phase interval (4)p in the previous cycle and the logical value from the flip flop circuit FF2 in the phase interval (2) are compared with each other. When the logical values match with each other as a result of the comparison, the clock control circuit CL-CT does not execute the phase comparison operation. On the contrary, when the logical values do not match with each other, the clock control circuit CL-CT executes the phase comparison operation. In the phase comparison operation at that time, the logical value from the flip flop circuit FF1 and the logical values of the flip flop circuits FF2 and FF4 are compared with each other.

In the comparison, when the logical value (logical value of phase interval (1)) of the flip flop circuit FF1 matches the logical value (logical value of phase interval (2)) of the flip flop circuit FF2, the phase (rise timing) of the clock signal is delayed, so that the clock control circuit CL-CT advances the phase of the clock signal by the control signal CPA-C. On the other hand, when the logical value (logical value of phase interval (1)) of the flip flop circuit FF1 matches the logical value (logical value of phase interval (4)p) of the flip flop circuit FF4, the phase (rise timing) of the clock signal is advanced, so that the clock control circuit CL-CT delays the phase of the clock signal by the control signal CPA-C.

For the first bit, similarly to the second bit, in the state of the optimal phases, the control signal CPA-C for delaying the phases and the control signal CPA-C for advancing the phases are alternately provided to the clock phase adjustment circuit CPA from the clock control circuit CL-CT. That is, the clock phase adjustment circuit CPA alternately outputs the clock signals CL1-A-CL4-A obtained by delaying the phases of the clock signals CL1-CL4 and the clock signals CL1-A-CL4-A obtained by advancing the phases of the clock signals CL1-CL4.

Thus, the clock signals CL1-A-CL4-A adjusted to be suitable timing for taking in the input signal In are provided to the flip flop circuits FF1-FF4.

However, each of the clock signals CL1-A-CL4-A provided to each clock input terminal CK of the flip flop circuits FF1-FF4 varies due to the wiring for transmitting the clock signal, variation of devices included in the clock phase adjustment circuit CPA, and the like. For example, when the CDR circuit CD is incorporated in the semiconductor device, each of the clock signals CL1-A-CL4-A varies due to variation during manufacturing of the semiconductor device. That is, delay time between the clock signals varies, and skew is generated. In FIGS. 10B-10E, for describing the principle of the CDR circuit CD, a state has been illustrated in which the phase intervals (1)-(4) are the same time with each other, and the skew is not generated. However, due to the variation of the wiring, devices, and the like, the skew is generated between the clock signals. In FIGS. 11A-11D, waveforms are illustrated of the clock signals CL1-A-CL4-A in a state in which the skew is generated. Also FIGS. 11A-11D, the horizontal axis indicates the time t.

FIG. 11A illustrates a voltage waveform of the clock signal CL1-A; FIG. 11B illustrates a voltage waveform of the clock signal CL2-A; FIG. 11C illustrates a voltage waveform of the clock signal CL3-A; FIG. 11D illustrates a voltage waveform of the clock signal CL4-A. When the clock signal CL2-A illustrated in FIG. 11B is viewed, in comparison with the clock signal CL2-A of FIG. 10C, the phase interval (1) is longer that is from rise of the clock signal CL1-A until rise of the clock signal CL2-A. In addition, when the clock signal CL3-A is viewed, the phase interval (2) is short in FIG. 11C; when the clock signal CL4-A is viewed, the phase interval (3) is long in FIG. 11D; when the clock signal CL1-A is viewed, the phase interval (4) is short in FIG. 11A.

Those clock signals CL1-A-CL4-A correspond to the clock signals CL1-CL4 formed based on the same reference clock signal CLr, so that a total (total time) of the phase intervals (1)-(4) is the same as one period T of the reference clock signal CLr (clock signal CL1-A)

As described in FIG. 9 and FIGS. 10A-10E, even when the phases of the clock signals CL1-CL4 are adjusted by the clock control circuit CL-CT and the clock phase adjustment circuit CPA, and the clock signals CL1-A-CL4-A adjusted are formed, when there is skew in the clock signals CL1-A-CL4-A as illustrated in FIGS. 11A-11D, it becomes difficult to make the phase of each of the clock signals CL1-A-CL4-A appropriate. For example, distortion in which the high level period and the low level period are shifted from 50%, so-called DCD (Duty Cycle Distortion) is generated in the clock signals, and each of the clock signals does not rise to the high level at appropriate timing any longer.

As a result, it becomes difficult to take in the input signal In to the flip flop circuits FF1-FF4 at the appropriate timing, and leads to occurrence of erroneous operation.

<Overall Configuration of Skew Adjustment Circuit>

FIG. 1 is a block diagram illustrating an overall configuration of a skew adjustment circuit according to the first embodiment. In FIG. 1, a skew adjustment circuit SKC is illustrated. In the first embodiment, the skew adjustment circuit SKC is applied to the CDR circuit CD illustrated in FIG. 9, so that a configuration of the CDR circuit CD illustrated in FIG. 9 is also illustrated in FIG. 1. That is, in FIG. 1, the receiver amplifier RCA, the flip flop circuits FF1-FF4, the clock control circuit CL-CT, the clock phase adjustment circuit CPA, the PLL circuit PL, and the reference clock signal formation circuit CGC have the same configuration as each of those illustrated in FIG. 9. Therefore, for the receiver amplifier RCA, the flip flop circuits FF1-FF4, the clock control circuit CL-CT, the clock phase adjustment circuit CPA, the PLL circuit PL, and the reference clock signal formation circuit CGC, the description is omitted in principle.

The skew adjustment circuit SKC includes a phase interval adjustment circuit PDC, a phase interval detection circuit PDD, and a calibration control unit PDD-CT. The phase interval detection circuit PDD receives a clock signal provided to each of the clock input terminals CK of the flip flop circuits FF1-FF4, and detects a phase interval between the clock signals provided to the clock input terminals CK. The skew adjustment signal generated by detection is provided to the phase interval adjustment circuit PDC. The phase interval adjustment circuit PDC receives the clock signals CL1-A-CL4-A (described later) output from the clock phase adjustment circuit CPA, and, based on the skew adjustment signal from the phase interval detection circuit PDD, adjusts the phase interval between the clock signals, and provides the clock signals adjusted to the clock input terminals CK of the flip flop circuits FF1-FF4.

In the first embodiment, the phase interval detection circuit PDD has a reference value of the phase interval, and, based on the reference value, detects the phase interval between the clock signals provided to the clock input terminals CK of the flip flop circuits FF1-FF4, and outputs the skew adjustment signal for matching the phase interval between the clock signals with the reference value. The calibration control unit PDD-CT is a control unit for correcting the reference value of the phase interval that is changed by variation of the wiring, devices, and the like.

Even when the skew is generated and the phase intervals (1)-(4) between the clock signals CL1-A-CL4-A are different values from each other as illustrated in FIGS. 11A-11D, each of those clock signals CL1-A-CL4-A is formed based on the reference clock signal CLr. Therefore, the total being a total of the phase intervals (1)-(4) is equal to the one period T of the reference clock signal CLr (for example, the same clock signal as the clock signal CL1-A). By dividing time of the one period T by the number of the multiple phases of clock signals CL1-A-CL4-A having been formed, a time difference is obtained of the phase interval between the clock signals being adjacent to each other. The time difference of the phase interval obtained by division is made to be the reference value of the phase interval. The total of the phase intervals (1)-(4) does not depend on the variation of the wiring, devices, and the like, so that the reference value obtained is also a value that does not depend on the variation of the wiring, devices, and the like.

In the first embodiment, the CDR circuit CD or the semiconductor device incorporating the CDR circuit CD includes a skew calibration period separately from a clock data recovery period for recovering the data and clock. The skew calibration period includes a calibration period and a phase interval adjustment period. In the calibration period, the calibration control unit PDD-CT obtains the phase interval between the clock signals CL1-A-CL4-A by using the phase interval detection circuit PDD. In addition, the calibration control unit PDD-CT performs totaling of the phase interval obtained and division to obtain the reference value of the phase interval, and provides the reference value to the phase interval detection circuit PDD. The phase interval adjustment period exists after the calibration period, and, in the phase interval adjustment period, the phase interval detection circuit PDD, based on the reference value, outputs the skew adjustment signal to adjust the phase interval between the clock signals. From a different viewpoint, the phase interval detection circuit PDD is used for detecting the phase interval between the clock signals in the calibration period, and is used for forming the skew adjustment signal based on the reference value in the phase interval adjustment period. Thus, by using for both, an increase of an occupied area can be suppressed.

<Configuration of Skew Adjustment Circuit>

Figure 2:
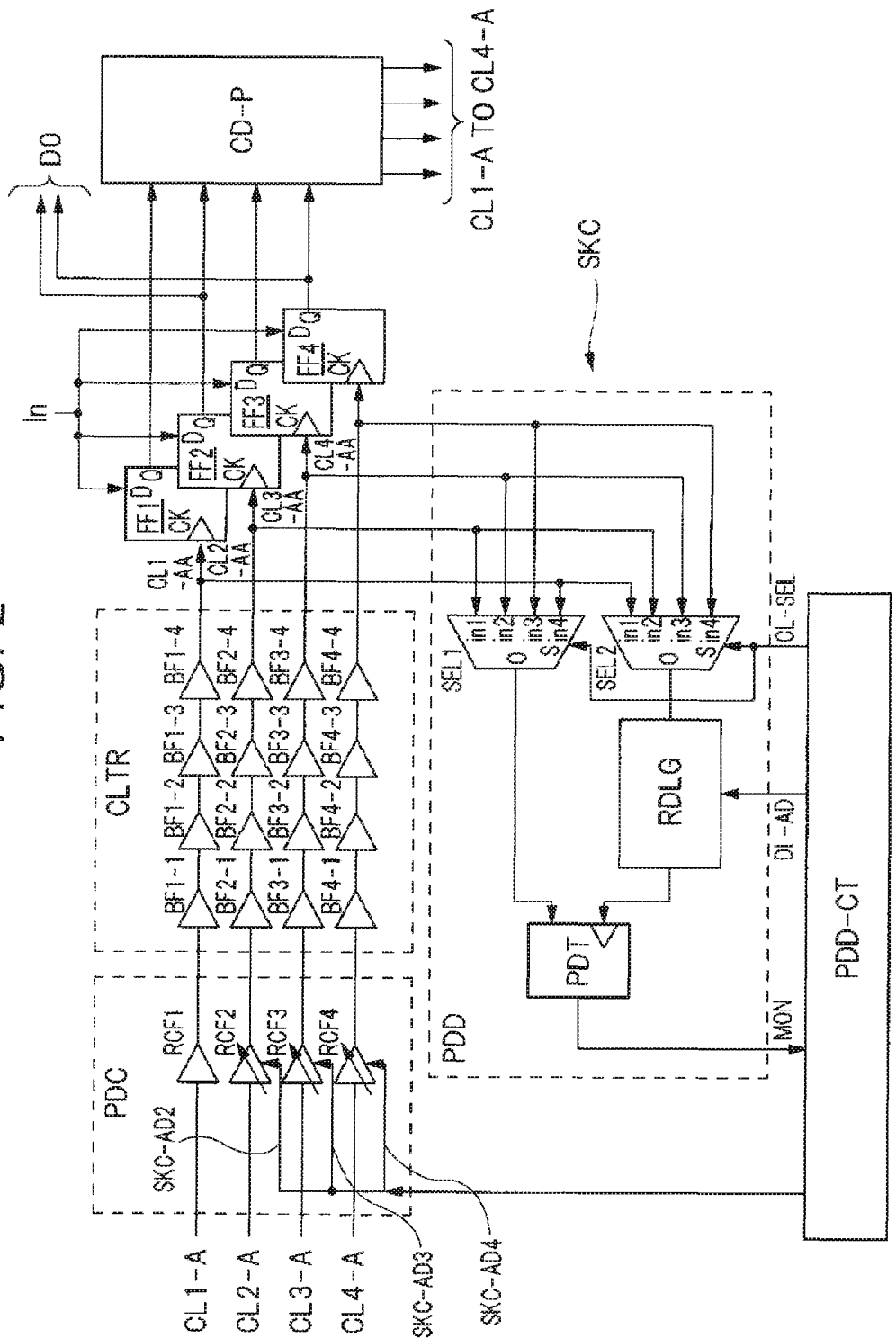
FIG. 2 is a block diagram illustrating a configuration of the skew adjustment circuit according to the first embodiment.

FIG. 2 is a block diagram illustrating a configuration of the skew adjustment circuit SKC illustrated in FIG. 1. In FIG. 2, a CDR control logical unit CD-P configuring the CDR circuit CD is illustrated. In correspondence with FIG. 1, the CDR control logical unit CD-P includes the clock control circuit CL-CT and the clock phase adjustment circuit CPA illustrated in FIG. 1, and is provided with the output signal from each of the output terminals Q of the flip flop circuits FF1-FF4, and outputs the clock signals CL1-A-CL4-A to which phase adjustment is performed from the clock phase adjustment circuit CPA. In the first embodiment, outputs from the flip flop circuits FF2 and FF4 are output as the output signals (data) D0 recovered.

The phase interval adjustment circuit PDC includes buffer circuits RCF1-RCF4 respectively corresponding to clock signals CL1-A-CL4-A from the CDR control logical unit CD-P. In the first embodiment, for the buffer circuits RCF2-RCF4 to which the clock signals CL2-A-CL4-A are respectively provided, each delay time is determined by the skew adjustment signal SKC-AD2-SKC-AD4. That is, the delay time of the buffer circuit RCF2 is determined by the skew adjustment signal SKC-AD2; the delay time of the buffer circuit RCF3 is determined by the skew adjustment signal SKC-AD3; the delay time of the buffer circuit RCF4 is determined by the skew adjustment signal SKC-AD4.

In the first embodiment, phases of the clock signals CL2-A-CL4-A are adjusted by changing each delay time of the buffer circuits RCF2-RCF4; however, it is not limited thereto. That is, not limited to the buffer circuit, a circuit can be used capable of adjusting the phases of the clock signals CL2-A-CL4-A by the skew adjustment signals SKC-AD2-SKC-AD4. In addition, similarly to the buffer circuits RCF2-RCF4, the buffer circuit RCF1 corresponding to the clock signal CL1-A can be configured by a variable delay buffer circuit capable of setting the delay time by the skew adjustment signal.

In the first embodiment, the clock signals whose phase interval is adjusted by the phase interval adjustment circuit PDC is provided to the clock input terminals CK of the flip flop circuits FF1-FF4 via a clock tree CLTR. In FIG. 2, an example is illustrated in which the clock tree CLTR is configured by the buffer circuits BF1-1-BF4-4.

That is, the clock signal (second clock signal) CL1-A output from the buffer circuit RCF1 is provided as a clock signal (first clock signal) CL1-AA to the clock input terminal CK of the flip flop circuit FF1 via the buffer circuits BF1-1-BF1-4 serially connected to each other. In addition, the clock signal (second clock signal) CL2-A output from the buffer circuit RCF2 is provided as a clock signal (first clock signal) CL2-AA to the clock input terminal CK of the flip flop circuit FF2 via the buffer circuits BF2-1-BF2-4 serially connected to each other; the clock signal (second clock signal) CL3-A output from the buffer circuit RCF3 is provided as a clock signal (first clock signal) CL3-AA to the clock input terminal CK of the flip flop circuit FF3 via the buffer circuits BF3-1-BF3-4 serially connected to each other. Further, the clock signal (second clock signal) CL4-A output from the buffer circuit RCF4 is provided as a clock signal (first clock signal) CL4-AA to the clock input terminal CK of the flip flop circuit FF4 via the buffer circuit BF4-1-BF4-4 serially connected to each other.

Devices configuring each of the buffer circuits BF1-1-BF4-4 configuring the clock tree CLTR varies in characteristics due to manufacturing variation. As a result, as described in FIGS. 11A-11D, the skew is generated between the clock signals provided to the clock input terminals CK of the flip flop circuits FF1-FF4. The buffer circuits BF1-1-BF4-4 configuring the clock tree CLTR can be wiring. Even when it is the wiring, the characteristic of the wiring varies due to manufacturing variation. As a result, as described in FIGS. 11A-11D, the skew is generated between the clock signals provided to the clock input terminals CK of the flip flop circuits FF1-FF4.

Here, a case has been described in which the skew is generated between the clock signals provided to the clock input terminals CK of the flip flop circuits FF1-FF4 due to the manufacturing variation, in the clock tree CLTR; however, the case is an example, and is not limited thereto.

The phase interval detection circuit PDD includes selectors SEL1, SEL2, a reference delay generation circuit RDLG, and a phase comparison circuit PDT.

Each of the selectors SEL1 and SEL2 includes four input terminals in1-in4, a selection terminal S, and an output terminal O. A clock selection signal CL-SEL is provided to the selection terminal S of each of the selectors SEL1 and SEL2. Each of the selectors SEL1 and SEL2 selects anyone of the input terminals in1-in4 in accordance with the clock selection signal CL-SEL, and connects the input terminal selected to the output terminal O. In the first embodiment, by the clock selection signal CL-SEL, each of the selectors SEL1 and SEL2 selects the same input terminal to connect the terminal to the output terminal O. That is, when the input terminal in1 is selected in the selector SEL1, the input terminal in1 is selected also in the selector SEL2, and each input terminal selected is connected to the output terminal O.

Similarly, when the input terminal in2 is selected in the selector SEL1, the input terminal in2 is selected also in the selector SEL2; when the input terminal in3 is selected in the selector SEL1, the input terminal in3 is selected also in the selector SEL2; when the input terminal in4 is selected in the selector SEL1, the input terminal in4 is selected also in the selector SEL2.

The clock signal CL1-AA provided to the clock ingot terminal CK of the flip flop circuit FF1 is provided to the input terminal in4 of the selector SEL1 and the input terminal in1 of the selector SEL2. In addition, the clock signal CL2-AA provided to the clock input terminal CK of the flip flop circuit FF2 is provided to the input terminal in1 of the selector SEL1 and the input terminal in2 of the selector SEL2, and the clock signal CL3-AA provided to the clock input terminal CK of the flip flop circuit FF3 is provided to the input terminal in2 of the selector SEL1 and the input terminal in3 of the selector SEL2. Further, the clock signal CL4-AA provided to the clock input terminal CK of the flip flop circuit FF4 is provided to the input terminal in3 of the selector SEL1 and the input terminal in4 of the selector SEL2.

Thus, when the input terminal in1 of each of the selectors SEL1, SEL2 is selected by the clock selection signal CL-SEL, the clock signal CL2-AA is output from the output terminal O of the selector SEL1, and the clock signal CL1-AA is output from the output terminal O of the selector SEL2. In addition, when the input terminal in2 of each of the selectors SEL1, SEL2 is selected by the clock selection signal CL-SEL, the clock signal CL3-AA is output from the output terminal O of the selector SEL1, and the clock signal CL2-AA is output from the output terminal O of the selector SEL2.

Similarly, when the input terminal in3 of each of the selectors SEL1, SEL2 is selected by the clock selection signal CL-SEL, the clock signal CL4-AA is output from the output terminal O of the selector SEL1, and the clock signal CL3-AA is output from the output terminal O of the selector SEL2. Further, when the input terminal in4 of each of the selectors SEL1, SEL2 is selected by the clock selection signal CL-SEL, the clock signal CL1-AA is output from the output terminal O of the selector SEL1, and the clock signal CL4-AA is output from the output terminal O of the selector SEL2.

The clock signal CL2-AA and the clock signal CL1-AA are clock signals whose phases are close to each other. Therefore, when the input terminal in1 is selected by the clock selection signal CL-SEL, the clock signals whose phases are close to each other are output from the selectors SEL1 and SEL2. Similarly, the clock signal CL3-AA and the clock signal CL2-AA are the clock signals whose phases are close to each other; the clock signal CL4-AA and the clock signal CL3-AA are the clock signals whose phases are close to each other; the clock signal CL1-AA and the clock signal CL4-AA are the clock signals whose phases are close to each other. Therefore, when the input terminal is selected by the clock selection signal CL-SEL, the clock signals whose phases are close to each other are output from the selectors SEL1 and SEL2.

The output terminal O of the selector SEL2 is connected to the reference delay generation circuit RDLG. That is, the clock signal selected by the selector SEL2 is provided to the reference delay generation circuit RDLG. The reference delay generation circuit RDLG is provided with a delay adjustment signal DL-AD, and the delay time is determined by the delay adjustment signal DL-AD. That is, the reference delay generation circuit RDLG delays the clock signal provided from the selector SEL2 by the delay time determined by the delay adjustment signal DL-AD to output the signal.

The clock signal delayed by the reference delay generation circuit RDLG and the clock signal selected by the selector SEL1 are provided to the phase comparison circuit PDT. The phase comparison circuit PDT performs comparison of the phases between the clock signals from the reference delay generation circuit RDLG and the clock signal from the selector SEL1, and outputs the comparison result as a monitor signal MON.

The phase comparison circuit PDT is configured by, for example, a flip flop circuit. In that case, for example, the clock signal from the reference delay generation circuit RDLG is provided to the clock input terminal of the flip flop circuit, and the clock signal from the selector SEL1 is provided to the input terminal of the flip flop circuit. Thus, for example, when the clock signal from the reference delay generation circuit RDLG rises, the clock signal from the selector SEL1 becomes capable of forming the monitor signal MON depending on the high level or the low level. For example, when the monitor signal MON is the high level, it can be determined that the phase of the clock signal output from the selector SEL1 is advanced, and, when the monitor signal MON is the low level, it can be determined that the phase of the clock signal output from the selector SEL1 is delayed.

Since the clock signals whose phases are close to each other are selected by the selector SEL1 and the selector SEL2, one clock signal of the two clock signals whose phases are adjacent to each other is delayed by the reference delay generation circuit RDLG, and the phase is compared with that of the other clock signal. For example, when the input terminal in1 of each of the selectors SEL1 and SEL2 is selected by the clock selection signal CL-SEL, the clock signal CL1-AA is provided to the reference delay generation circuit RDLG, and is delayed by predetermined delay time by the delay adjustment signal DL-AD to be provided to the phase comparison circuit PDT. At that time, the clock signal CL2-AA is provided from the selector SEL1 to the phase comparison circuit PDT. It is the same when the other input terminal is selected by the clock selection signal CL-SEL.

The calibration control unit PDD-CT receives the monitor signal MON described above, and outputs the clock selection signal CL-SEL, the delay adjustment signal DL-AD, and the skew adjustment signal SKC-AD2-SKC-AD4.

<<Calibration Control Unit>>

Figure 3:
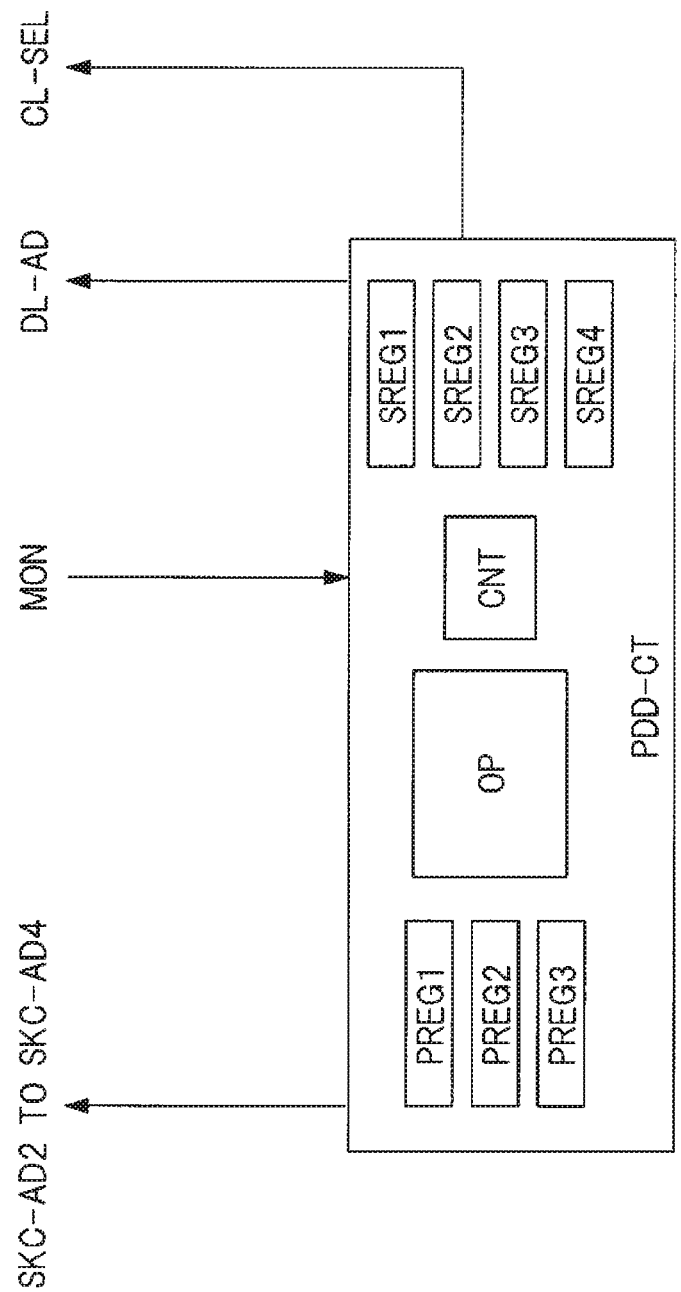
FIG. 3 is a block diagram illustrating a configuration of a calibration control unit according to the first embodiment.

FIG. 3 is a block diagram illustrating a configuration of the calibration control unit PDD-CT according to the first embodiment. The calibration control unit PDD-CT includes an operation circuit OP, skew registers SREG1-SREG4, adjustment registers PREG1-PREG3, and a state control unit CNT. The state control unit CNT controls the entire of the calibration control unit PDD-CT. When controlling the entire of the calibration control unit PDD-CT, the state control unit CNT uses the operation circuit OP, the skew registers SREG1-SREG4, and the adjustment registers PREG1-PREG3.

The skew registers SREG1-SREG4 are used for detecting the phase interval between the clock signals CL1-AA-CL4-AA provided to the flip flop circuits FF1-FF4. Although it is not particularly limited, the skew register SREG1 corresponds to a phase interval between the clock signals CL1-AA and the clock signal CL2-AA, and is used for detecting the phase interval. In addition, the skew register SREG2 corresponds to a phase interval between the clock signals CL2-AA and the clock signal CL3-AA, and is used for detecting the phase interval; the skew register SREG3 corresponds to a phase interval between the clock signals CL3-AA and the clock signal CL4-AA, and is used for detecting the phase interval. Similarly, the skew register SREG4 corresponds to a phase interval between the clock signals CL4-AA and the clock signal CL1-AA, and is used for detecting the phase interval.

The operation circuit OP is used in an operation for obtaining the reference value of the phase interval in calibration operation. Although it is described later with reference to FIG. 4, in the calibration operation, time information of the corresponding phase interval is stored in each of the skew registers SREG1-SREG4, and the operation circuit OP calculates the reference value of the phase interval by the operation of time information of the phase interval stored in the skew registers SREG1-SREG4.

The adjustment registers PREG1-PREG3 store phase interval information generated based on the reference value calculated. The phase interval information stored in the adjustment registers PREG1-PREG3 is output as the skew adjustment signal SKC-AD2-SKC-AD4. Although it is not particularly limited, the skew adjustment signal SKC-AD2 is based on the phase interval information stored in the adjustment register PREG1; the skew adjustment signal SKC-AD3 is based on the phase interval information stored in the adjustment register PREG2; the skew adjustment signal SKC-AD4 is based on the phase interval information stored in the adjustment register PREG3. Or course, the operation circuit OP, the skew registers SREG1-SREG4, and the adjustment registers PREG1-PREG3 can also be used for another processing.

<<Skew Calibration Operation>>

Figure 4:
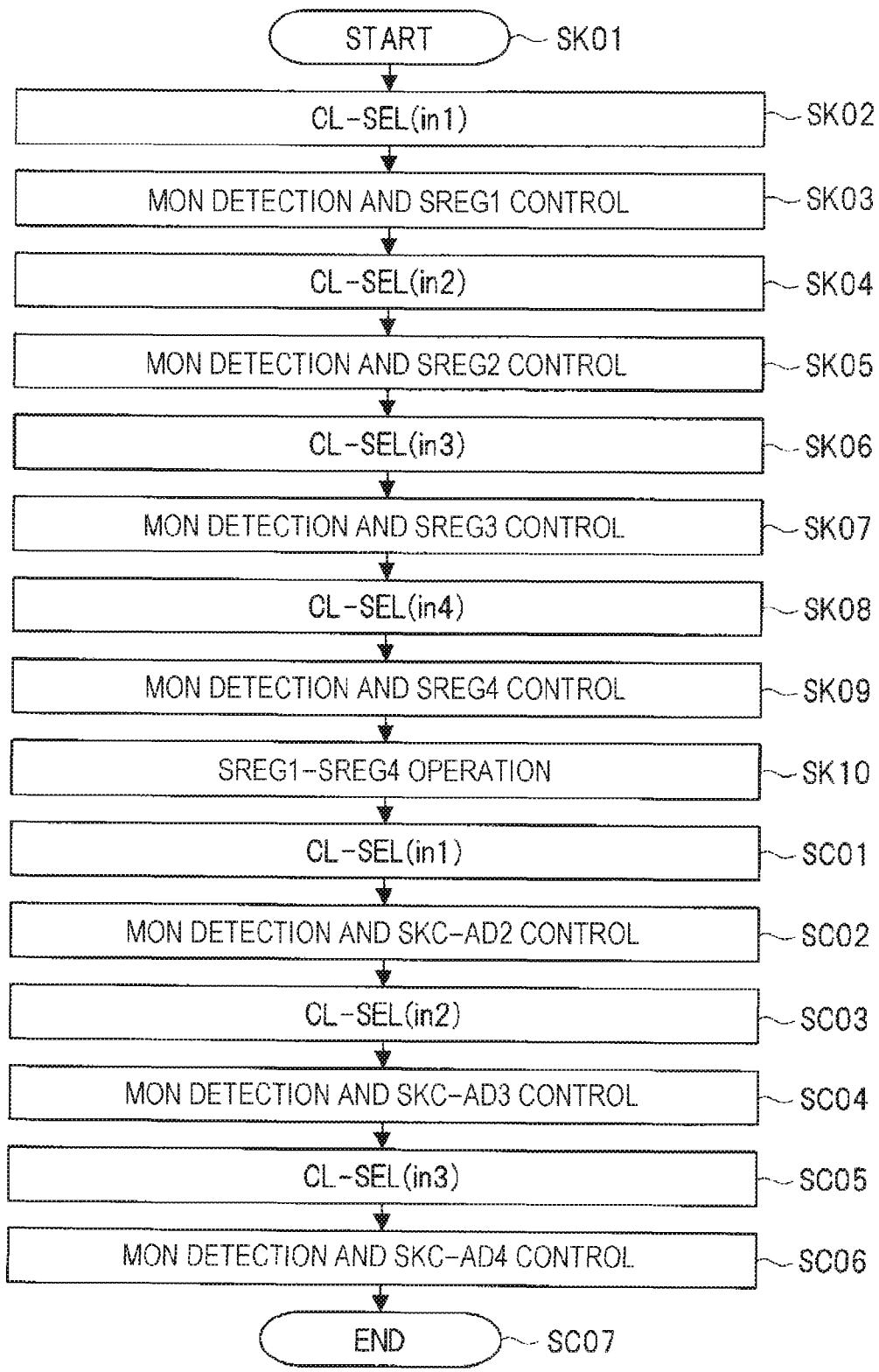
FIG. 4 is a flowchart diagram illustrating operation of the skew adjustment circuit according to the first embodiment.

Next, operation performed in the skew calibration period (skew calibration operation), that is, calibration operation performed in the calibration period, and phase interval adjustment operation performed in the phase interval adjustment period are described. FIG. 4 is a flowchart diagram illustrating operation of the skew adjustment circuit SKC according to the first embodiment. The skew calibration operation is described with reference to FIG. 2-FIG. 4.

The skew calibration operation, in FIG. 4, starts at step SK01 (START), and ends at step SC07 (END). Here, in the skew calibration operation, the calibration operation is described that is executed earlier in time, and then the phase interval adjustment operation is described that is executed later in time.

<<Calibration Operation>>

The calibration operation is achieved by steps SK02-SK10. In step SK02, the state control unit CNT selects the input terminal in1 of each of the selectors SEL1, SEL2 by the clock selection signal CL-SEL (in FIG. 4, described as CL-SEL (in1)). Thus, the selector SEL1 selects the clock signal CL2-AA to output the clock signal from the output terminal O. In addition, the selector SEL2 selects the clock signal CL1-AA to output the clock signal from the output terminal O.

As a result, the clock signal CL2-AA and the clock signal CL1-AA delayed by the reference delay generation circuit RDLG are provided to the phase comparison circuit PDT, and a signal depending on the phase between the clock signals provided is output as the monitor signal MON. For example, when a phase of a clock signal provided from the reference delay generation circuit RDLG is advanced compared to a clock signal provided from the selector SEL1, the phase comparison circuit PDT outputs the monitor signal MON of the low level. On the contrary, when the phase of the clock signal provided from the reference delay generation circuit RDLG is delayed compared to the clock signal provided from the selector SEL1, the phase comparison circuit PDT outputs the monitor signal MON of the high level.

In the first embodiment, the phase comparison circuit PDT treats the timing in which the clock signal to be provided rises to the high level from the low level, as a phase of the clock signal. That is, the phase comparison circuit PDT, when rise timing of the clock signal provided from the reference delay generation circuit RDLG is advanced compared to rise timing of the clock signal provided from the selector SEL1, outputs the monitor signal MON of the low level. On the contrary, the phase comparison circuit PDT, when the rise timing of the clock signal provided from the reference delay generation circuit RDLG is delayed compared to the rise timing of the clock signal provided from the selector SEL1, outputs the monitor signal MON of the high level.

In step SK03, the state control unit CNT detects the monitor signal MON, and controls the skew register SREG1 (MON detection and SREG1 control). That is, the state control unit CNT detects whether the monitor signal MON is the high level or the low level. In accordance with the result of the detection, the state control unit CNT controls the skew register SREG1. When the monitor signal MON is the low level, the state control unit CNT performs, for example, count-up of a value of the skew register SREG1. The value of the skew register SREG1 is output as the delay adjustment signal DL-AD from the calibration control unit PPD-CT. Therefore, due to the fact that count-up of the skew register SREG1 is performed, a value of the delay adjustment signal DL-AD is increased. Delay time generated by the reference delay generation circuit RDLG becomes longer due to the fact that the value of the delay adjustment signal DL-AD is increased.

The state control unit CNT, in step SK03, repeats the operation described above until the monitor signal MON becomes the high level. That is, count-up of the value of the skew register SREG1 is performed until the monitor signal MON becomes the high level. Thus, the value of the delay adjustment signal DL-AD is gradually increased, and the delay time generated by the reference delay generation circuit RDLG gradually becomes longer.

Due to the fact that the delay time generated by the reference delay generation circuit RDLG gradually becomes longer, the phase of the clock signal provided to the phase comparison circuit PDT from the reference delay generation circuit RDLG, that is, the rise timing of the clock signal is delayed.

The state control unit CNT, when the monitor signal MON is changed to the high level, stops count-up operation for the skew register SREG1. Thus, the skew register SREG1, when the monitor signal MON is the low level, stores and holds the count-up value. When a phase relationship is inverted between the phase (rise timing) of the clock signal CL2-AA selected by the selector SEL1 and the phase (rise timing) of the clock signal from the reference delay generation circuit RDLG, the monitor signal MON is changed to the high level from the low level. Therefore, the delay time corresponding to the time difference being the phase interval between the phase (rise timing) of the clock signal CL2-AA selected by the selector SEL1 and the phase (rise timing) of the clock signal CL1-AA selected by the selector SEL2, is formed by the reference delay generation circuit RDLG. The delay time generated by the reference delay generation circuit RDLG is determined by the delay adjustment signal DL-AD based on the value of the skew register SREG1, so that the value stored in the skew register SREG1 represents the phase interval (time difference between rise timings) between the clock signals CL1-AA and the clock signal CL2-AA.

Next, in step SK04, the state control unit CNT selects the input terminal (in2) of each of the selectors SEL1, SEL2 by the clock selection signal CL-SEL (CL-SEL (in2)). Thus, the clock signal CL2-AA delayed by the reference delay generation circuit RDLG and the clock signal CL3-AA selected by the selector SEL1 are provided to the phase comparison circuit PDT. Next, in step SK05, the state control unit CNT, similarly to step SK03, performs detection of the monitor signal MON and control of the skew register SREG2 (MON detection and SREG2 control). In step SK05, control is performed of the skew register SREG2 instead of the skew register SREG1.

That is, the state control unit CNT detects whether the monitor signal MON is the high level or the low level, and, when the monitor signal MON is the low level, performs count-up of the skew register SREG2. The state control unit CNT performs count-up of the skew register SREG2 until the monitor signal MON becomes the high level, and, when the monitor signal MON becomes the high level, stops count-up of the skew register SREG2. Thus, a value indicating a time difference corresponding to the phase interval between the clock signals CL2-AA and the clock signal CL3-AA is stored and held in the skew register SREG2.

In step SK06, the state control unit CNT selects the input terminal (in3) of each of the selectors SEL1, SEL2 by the clock selection signal CL-SEL (CL-SEL (in3)). Thus, the clock signal CL3-AA delayed by the reference delay generation circuit RDLG and the clock signal CL4-AA selected by the selector SEL1 are provided to the phase comparison circuit PDT. Next, in step SK07, the state control unit CNT, similarly to step SK03, performs detection of the monitor signal MON and control of the skew register SREG3 (MON detection and SREG3 control). In step SK07, control is performed of the skew register SREG3 instead of the skew register SREG1.

That is, the state control unit CNT detects whether the monitor signal MON is the high level or the low level, and, when the monitor signal MON is the low level, performs count-up of the skew register SREG3. The state control unit CNT performs count-up of the skew register SREG3 until the monitor signal MON becomes the high level, and, when the monitor signal MON becomes the high level, stops count-up of the skew register SREG3. Thus, a value indicating a time difference corresponding to the phase interval between the clock signals CL3-AA and the clock signal CL4-AA is stored and held in the skew register SREG3.

Further, in step SK08, the state control unit CNT selects the input terminal (in4) of each of the selectors SEL1, SEL2 by the clock selection signal CL-SEL (CL-SEL (in4)). Thus, the clock signal CL4-AA delayed by the reference delay generation circuit RDLG and the clock signal CL1-AA selected by the selector SEL1 are provided to the phase comparison circuit PDT. Next, in step SK09, the state control unit CNT, similarly to step SK03, performs detection of the monitor signal MON and control of the skew register SREG4 (MON detection and SREG4 control). In step SK09, control is performed of the skew register SREG4 instead of the skew register SREG1.

That is, the state control unit CNT detects whether the monitor signal MON is the high level or the low level, and, when the monitor signal MON is the low level, performs count-up of the skew register SREG4. The state control unit CNT performs count-up of the skew register SREG4 until the monitor signal MON becomes the high level, and, when the monitor signal MON becomes the high level, stops count-up of the skew register SREG4. Thus, a value indicating a time difference corresponding to the phase interval between the clock signals CL4-AA and the clock signal CL1-AA is stored and held in the skew register SREG4.

In step SK10, the state control unit CNT obtains a summation (total) of the time differences corresponding to the phase intervals stored in the skew registers SREG1-SREG4 by an operation using the operation circuit OP. The total obtained is divided by the number of phases (the number) of the multiple phases of clock signals provided to the flip flop circuits FF1-FF4, and the reference value of the phase interval is obtained. In the first embodiment, the multiple phases of clock signals provided to the flip flop circuits FF1-FF4 are four phases, so that the total is divided by four, and the phase interval obtained by division is made to be the reference value (SREG1-SREG4 operation).

The state control unit CNT stores the reference value of the phase interval obtained in, for example, the skew register SREG1.

In step SK03, the value stored in the skew register SREG1 is a value of a time difference corresponding to a phase interval between the clock signals CL1-AA and CL2-AA; in step SK05, the value stored in the skew register SREG2 is a value of a time difference corresponding to a phase interval between the clock signals CL2-AA and CL3-AA. In addition, in step SK07, the value stored in the skew register SREG3 is a value of a time difference corresponding to a phase interval between the clock signals CL3-AA and CL4-AA; in step SK09, the value stored in the skew register SREG4 is a value of a time difference corresponding to a phase interval between the clock signals CL4-AA and CL1-AA.

In step SK10, a total of those time differences is obtained, and the total is divided by the number of phases, and the reference value is obtained. The total of the time differences corresponds to, for example, one period of the clock signal CL1-AA. In the first embodiment, the clock signal CL1-AA corresponds to the reference clock signal CLr, so that the total of the time differences corresponds to one period of the reference clock signal CLr. In the first embodiment, four phases of clock signals CL1-AA-CL4-AA having different phases from each other are formed during one period of the reference clock signal CLr. The reference value obtained by division corresponds to an average value of phase intervals between the four phases of clock signals formed at equal intervals from each other.

In the four phases of clock signals CL1-AA-CL4-AA, each of the phases varies due to manufacturing variation; however, those clock signals are formed based on one reference clock signal CLr, so that the period is hardly be affected by the manufacturing variation. Therefore, by performing adjustment so that a phase interval between clock signals whose phases are close to each other is matched with the reference value described above, four phases of clock signals can be formed that have equally spaced phase intervals and are hardly be affected by the manufacturing variation.

In the above description, as an example, the case has been described in which the clock signal provided to the phase comparison circuit PDT from the reference delay generation circuit RDLG is faster (advanced) in the phase compared to the clock signal provided to the phase comparison circuit PDT from the selector SEL1. Therefore, count-up has been performed of the skew registers SREG1-SREG4 until the monitor signal MON has been changed to the high level from the low level. When the phase of the clock signal provided to the phase comparison circuit PDT from the reference delay generation circuit RDLG is delayed compared to the clock signal provided to the phase comparison circuit PDT from the selector SEL1, it is also the same as the above description. In that case, count-down is performed of values of the skew registers SREG1-SREG4 until the monitor signal MON is changed to the low level from the high level. By performing count-down, delay time formed by the reference delay generation circuit RDLG becomes shorter.

Also in that case, the value corresponding to the phase interval between adjacent clock signals is stored in each of the skew registers SREG1-SREG4, and in step SK10, the reference value is obtained.

Of course, in accordance with a phase relationship between the adjacent clock signals, count-up and count-down are mixed in the skew registers SREG1-SREG4. For example, depending on the phase relationship between the adjacent clock signals, count-up may be performed in the skew registers SREG1 and SREG4, and count-down may be performed in the skew registers SREG2 and SREG3. Even in that case, in step SK10, the total of the values corresponding to the phase intervals stored in the respective skew registers SREG1-SREG4 is obtained, and the reference value is obtained by division.

<<Phase Interval Adjustment Operation>>

Next, operation is described of adjusting the phase interval by using the reference value obtained. The reference value obtained in step SK10 is stored in the skew register SREG1. In phase interval adjustment operation, the reference value stored in the skew register SREG1 is provided as the delay adjustment signal DL-AD to the reference delay generation circuit RDLG. Thus, the reference delay generation circuit RDLG generates delay time of a phase interval corresponding to the reference value.

In step SC01, the state control unit CNT selects the input terminal in1 of each of the selectors SEL1, SEL2 by the clock selection signal CL-SEL (CL-SEL (in1)). Thus, the clock signal CL2-AA is provided via the selector SEL1 to the phase comparison circuit PDT. In addition, the clock signal CL1-AA is provided that is delayed by the delay time of the phase interval corresponding to the reference value, by the reference delay generation circuit RDLG, to the phase comparison circuit PDT.

In step SC02, the state control unit CNT controls the skew adjustment signal SKC-AD2 while detecting the monitor signal MON. For example, the phase comparison circuit PDT, when the phase of the clock signal CL2-AA provided from the selector SEL1 is advanced compared to the clock signal provided from the reference delay generation circuit RDLG, outputs the monitor signal MON of the high level. In that case, the state control unit CNT performs control so that the delay time of the buffer circuit RCF2 becomes longer, by the skew adjustment signal SKC-AD2. In that case, the delay time of the buffer circuit RCF2 is made to be longer by the skew adjustment signal SKC-AD2 until the monitor signal MON is changed to the low level, and the value of the skew adjustment signal SKC-AD2 at timing when the monitor signal MON becomes the low level is stored as the phase interval information in the adjustment register PREG1.

On the other hand, the phase comparison circuit PDT, when the phase of the clock signal CL2-AA provided from the selector SEL1 is delayed compared to the clock signal provided from the reference delay generation circuit RDLG, outputs the monitor signal MON of the low level. In that case, the state control unit CNT performs control so that the delay time of the buffer circuit RCF2 becomes shorter, by the skew adjustment signal SKC-AD2. In that case, the delay time of the buffer circuit RCF2 is made to be shorter by the skew adjustment signal SKC-AD2 until the monitor signal MON is changed to the high level, and the value of the skew adjustment signal SKC-AD2 at timing when the monitor signal MON becomes the high level is stored as the phase interval information in the adjustment register PREG1.

Thus, the phase of the clock signal CL2-AA is adjusted so that the phase interval between the clock signals CL1-AA and CL2-AA provided to the flip flop circuits FF1 and FF2 is matched with the reference value. In addition, the phase interval information for matching is stored in the adjustment register PREG1 in the skew calibration period.

Next, in step SC03, the state control unit CNT selects the input terminal in2 of each of the selectors SEL1, SEL2 by the clock selection signal CL-SEL (CL-SEL (in2)). Thus, the clock signal CL3-AA is provided from the selector SEL1 to the phase comparison circuit PDT. In addition, the clock signal CL2-AA delayed by delay time corresponding to the reference value by the reference delay generation circuit RDLG is provided to the phase comparison circuit PDT.

In step SC04, similarly to step SC02, the state control unit CNT controls the skew adjustment signal SKC-AD3 while detecting the monitor signal MON. That is, similarly to step SC02, the state control unit CNT performs control so that the delay time of the buffer circuit RCF3 is made to be longer or shorter by the skew adjustment signal SKC-AD3 until the monitor signal MON is changed to the low level from the high level, or changed to the high level from the low level. In addition, the state control unit CNT, at timing when the monitor signal MON is changed, stores the value of the skew adjustment signal SKC-AD3 at the timing as the phase interval information in the adjustment register PREG1.

Thus, the phase of the clock signal CL3-AA is adjusted so that the phase interval between the clock signals CL2-AA and CL3-AA provided to the flip flop circuits FF2 and FF3 is matched with the reference value. In addition, the phase interval information for matching is stored in the adjustment register PREG2 in the skew calibration period.

Further, in step SC05, the state control unit CNT selects the input terminal in3 of each of the selectors SEL1, SEL2 by the clock selection signal CL-SEL (CL-SEL (in3)). Thus, the clock signal CL4-AA is provided from the selector SEL1 to the phase comparison circuit PDT. In addition, the clock signal CL3-AA delayed by the delay time corresponding to the reference value by the reference delay generation circuit RDLG is provided to the phase comparison circuit PDT.

In step SC06, similarly to step SC02, the state control unit CNT controls the skew adjustment signal SKC-AD4 while detecting the monitor signal MON. That is, similarly to step SC02, the state control unit CNT performs control so that the delay time of the buffer circuit RCF4 is made to be longer or shorter by the skew adjustment signal SKC-AD4 until the monitor signal MON is changed to the low level from the high level, or changed to the high level from the low level. In addition, the state control unit CNT, at timing when the monitor signal MON is changed, stores the value of the skew adjustment signal SKC-AD4 at the timing as the phase interval information in the adjustment register PREG3.

Thus, the phase of the clock signal CL4-AA is adjusted so that the phase interval between the clock signals CL3-AA and CL4-AA provided to the flip flop circuits FF3 and FF4 is matched with the reference value. In addition, the phase interval information for matching is stored in the adjustment register PREG3 in the skew calibration period.

By executing the skew calibration operation illustrated in FIG. 4, it becomes possible to reduce that the phase interval varies between the clock signals provided to the flip flop circuits FF1-FF4 due to manufacturing variation, and occurrence of erroneous operation can be reduced. That is, in the clock data recovery period, it becomes possible to suppress that the timing varies at which each of the flip flop circuits FF1-FF4 takes in the input signal In, and occurrence of erroneous operation can be reduced.

Incidentally, in the first embodiment, in the phase interval adjustment operation, before the phase of the clock signal is adjusted, adjustment of the phase of the clock signal to be a reference is completed. For example, the phase of the clock signal CL3-AA is adjusted in step SC04; however, in step SC02 prior to step SC04, adjustment of the phase of the clock signal CL2-AA to be a reference to the clock signal CL3-AA has been completed. Thus, in step SC04, adjustment of the phase is performed only for one clock signal CL2-AA. Therefore, in step SC07, when the skew calibration operation has been finished, all phase intervals between the clock signals have become values matched with the reference value.

<Configuration of Phase Interval Adjustment Circuit>

Figure 5:
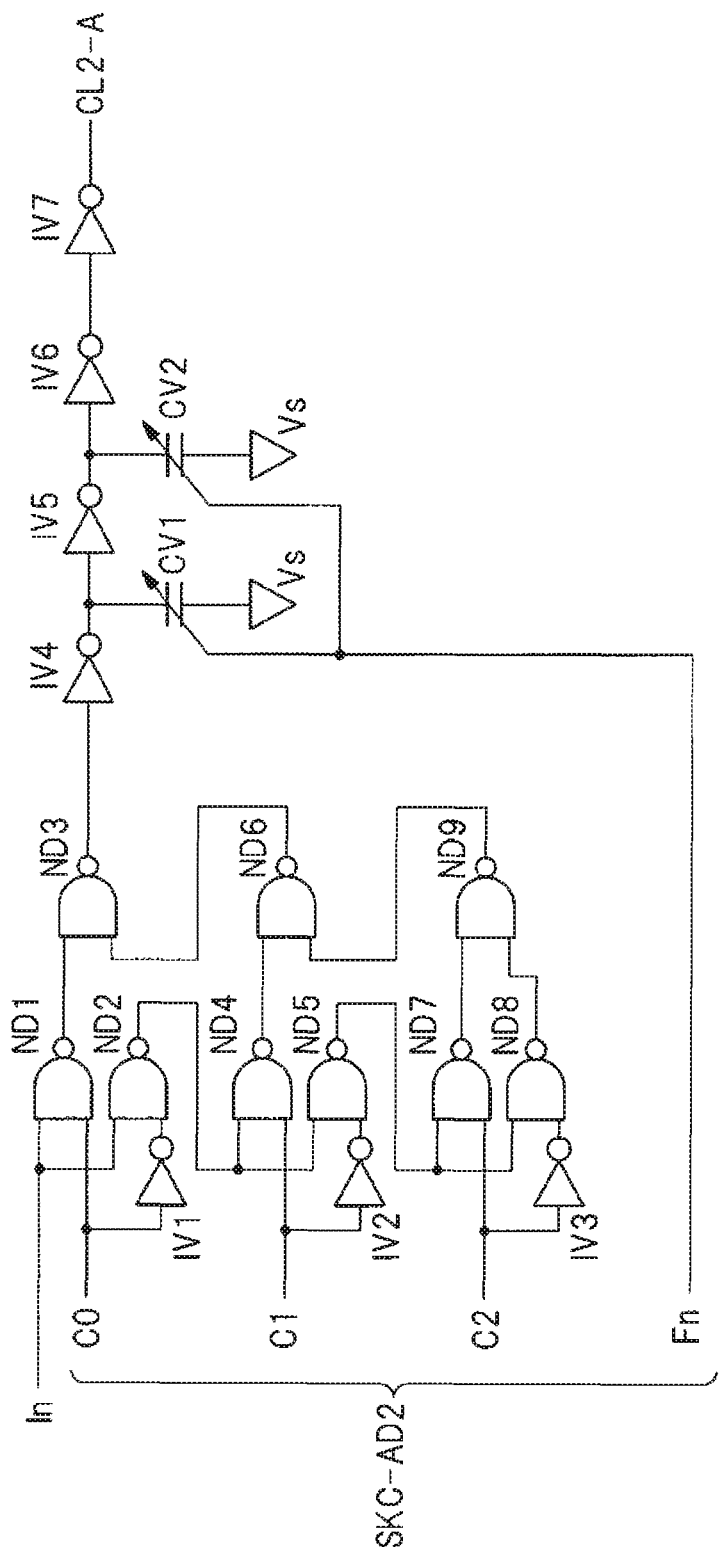
FIG. 5 is a circuit diagram illustrating a configuration of a phase interval adjustment circuit according to the first embodiment.

FIG. 5 is a circuit diagram illustrating a configuration of the phase interval adjustment circuit PDC according to the first embodiment. In FIG. 5, a configuration is illustrated of the buffer circuit (variable delay buffer circuit) RCF2 (FIG. 2) capable of changing the delay time, of the buffer circuits RCF1-RCF4 (FIG. 2) included in the phase interval adjustment circuit PDC.

The buffer circuit RCF2 is configured by two stages of delay circuits. That is, the buffer circuit RCF2 is configured by a first delay circuit for coarsely changing the delay time, and a second delay circuit for finely changing the delay time. The delay time is coarsely set by the first delay circuit, and the delay time is finely set by the second delay circuit. The skew adjustment signal SKC-AD2 is configured by multiple bits. Here, the skew adjustment signal SKC-AD2 is configured by bits C0-C2, and Fn, and those bits are provided to the buffer circuit RCF2 from the adjustment register PREG1 illustrated in FIG. 3.

The first delay circuit includes two-input NAND circuits ND1-ND9, and inverter circuits IV1-IV3. In addition, the second delay circuit includes inverter circuits IV4-IV7, and variable capacitors CV1, CV2.

The first delay circuit is configured by three-stage unit delay circuit to be controlled by the bits C0-C2. That is, the first-stage unit delay circuit is configured by the NAND circuits ND1-ND3 and the inverter circuit IV1, and is controlled by the bit C0. In addition, the second-stage unit delay circuit is configured by the NAND circuits ND4-ND6 and the inverter circuit IV2, and is controlled by the bit C1. Further, the third-stage unit delay circuit is configured by the NAND circuits ND7-ND9 and the inverter circuit IV3, and is controlled by the bit C2.

In the first-stage unit delay circuit to be controlled by the bit C0, the input signal In is provided to one input of each of the NAND circuits ND1, ND2; the bit C0 is provided to the other input of the NAND circuit ND1; the bit C0 that is inverted by the inverter circuit IV1 is provided to the other input of the NAND circuit ND2. An output of the NAND circuit ND1 is provided to one input of the NAND circuit ND3; an output of the NAND circuit ND2 is provided to the second-stage unit delay circuit; an output from the second-stage unit delay circuit is provided to the other input of the NAND circuit ND3. In addition, an output of the NAND circuit ND3 becomes an output of the first delay circuit.

In the second-stage unit delay circuit to be controlled by the bit C1, the output of the NAND circuit ND2 is provided to one input of each of the NAND circuits ND4, ND5; the bit C1 is provided to the other input of the NAND circuit ND4; the bit C1 that is inverted by the inverter circuit IV2 is provided to the other input of the NAND circuit ND5. An output of the NAND circuit ND4 is provided to one input of the NAND circuit ND6; an output of the NAND circuit ND5 is provided to the third-stage unit delay circuit; an output from the third-stage unit delay circuit is provided to the other input of the NAND circuit ND6. In addition, an output of the NAND circuit ND6 is provided to the other input of the NAND circuit ND3 in the first-stage unit delay circuit.

In the third-stage unit delay circuit to be controlled by the bit C2, the output of the NAND circuit ND5 is provided to one input of each of the NAND circuits ND7, ND8; the bit C2 is provided to the other input of the NAND circuit ND7; the bit C2 that is inverted by the inverter circuit IV3 is provided to the other input of the NAND circuit ND8. An output of the NAND circuit ND7 is provided to one input of the NAND circuit ND9; an output of the NAND circuit ND8 is provided to the other input of the NAND circuit ND9. The output of the NAND circuit ND9 is provided to the other input of the NAND circuit ND6 in the second-stage unit delay circuit.

For example, When the bits C0, C1, C2 are logical values "1," "0," "0," the input signal In is output via the NAND circuits ND1 and ND3 in the first stage unit delay circuit. In addition, when the bits C0, C1, C2 are logical values "0," "1," "0," the input signal In is output via the NAND circuits ND2, ND4, ND6, and ND3. Further, when the bits C0, C1, C2 are logical values "0," "0," "1," the input signal In is output via the NAND circuits ND2, ND5, ND7, ND9, ND6, and ND3. Thus, the number of NAND circuits through which the input signal In passes can be changed by the bits C0, C1, and C2, and the delay time of the first delay circuit can be changed.

In the second delay circuit., the inverter circuits IV4-IV7 are serially connected to each other. In addition, the variable capacitor CV1 is connected between an output of the inverter circuit IV4 and a ground voltage Vs, and the variable capacitor CV2 is connected between an output of the inverter circuit IV5 and the ground voltage Vs. Capacitance values of the variable capacitors CV1 and CV2 are determined by the bit Fn. Thus, the delay time of the second delay circuit can be finely changed by a value of the bit Fn.

Thus, the delay time given to the input signal In can be changed by the bits C0-C2, and Fn.

Each of the buffer circuits RCF3 and RCF4 has the same configuration as that of the buffer circuit RCF2. Each of the skew adjustment signals SKC-AD3, SKC-AD4 provided to the buffer circuits RCF3, RCF4 is configured by the bits C0-C2, and Fn, and those bits are provided to the buffer circuits RCF3, RCF4 from the adjustment registers PREG2, PREG3 illustrated in FIG. 3. Operation of the buffer circuits RCF3, RCF4 is the same as that of the buffer circuit RCF2, so that the description is omitted. In addition, the buffer circuit RCF1 includes, for example, multiple inverter circuits same as the inverter circuits IV4-IV7 illustrated in FIG. 5, and those inverter circuits are serially connected to each other to configure the buffer circuit. Incidentally, in the buffer circuit RCF1 illustrated in FIG. 2, the delay time is fixed, so that the buffer circuit RCF1 does not include the variable capacitors CV1, CV2 as illustrated in FIG. 5.

<Modification>

Figure 6:
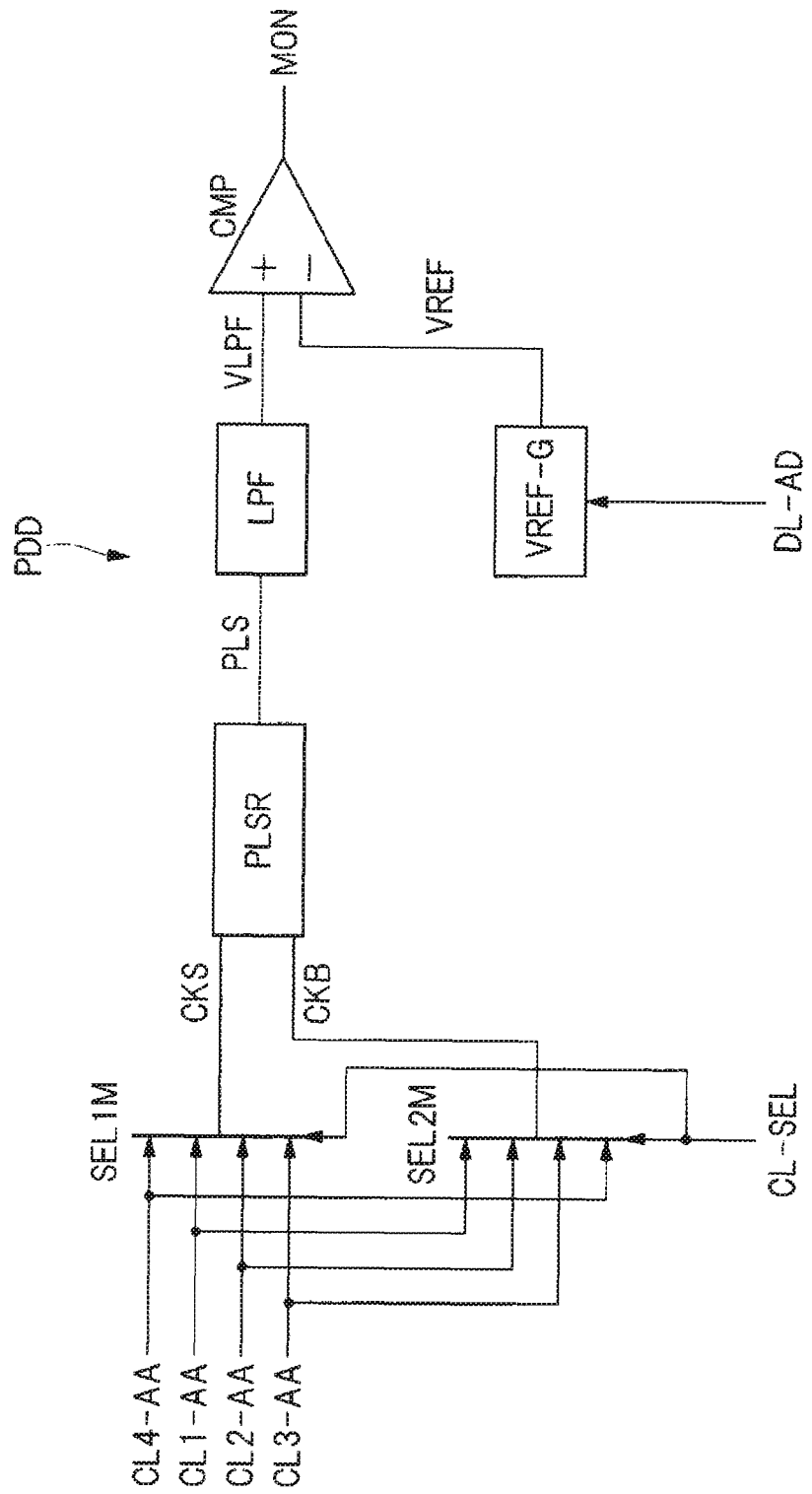
FIG. 6 is a circuit diagram illustrating a configuration of a phase interval detection circuit according to a modification of the first embodiment.

FIG. 6 is a circuit diagram illustrating a configuration of the phase interval detection circuit PDD according to a modification of the first embodiment. In FIG. 2, as the phase interval detection circuit PDD, the configuration has been described in which the flip flop circuit is used for the phase comparison circuit PDT. That is, in FIG. 2, the phase interval detection circuit configured by the digital circuit has been described. The phase interval detection circuit PDD can be configured by an analog circuit; in FIG. 6, an example is illustrated of the phase interval detection circuit PDD configured by the analog circuit.

In FIG. 6, selectors SEL1M, SEL2M are illustrated corresponding to the selectors SEL1, SEL2 illustrated in FIG. 2. Each of the selectors SEL1M, SEL2M illustrated in FIG. 6, similarly to the selectors SEL1, SEL2 illustrated in FIG. 2, selects the clock signals CL1-AA-CL4-AA in accordance with the clock selection signal CL-SEL. The selector SEL1M outputs a clock signal selected as a clock signal CKS, and the selector SEL2M outputs a clock signal selected as a clock signal CKB.

In FIG. 6, a pulse generation circuit PLSR is illustrated. The pulse generation circuit PLSR receives the clock signals CKS, CKB to generate a pulse signal PLS having a pulse width depending on a phase difference between the clock signal CKS and the clock signal CKB. That is, the pulse width of the pulse signal PLS becomes a width depending on a phase interval between the clock signal CKS and the clock signal CKB. The pulse signal PLS generated by the pulse generation circuit PLSR is provided to a low pass filter circuit LPF. The low pass filter circuit LPF converts the pulse signal PLS provided into voltage to output the signal as an analog voltage VLPF.

In addition, in FIG. 6, a reference voltage generation circuit VREF-G is illustrated for generating a reference voltage VREF depending on a value of the delay adjustment signal DL-AD. The reference voltage VREF generated by the reference voltage generation circuit VREF-G is provided to a negative input terminal (−) of an analog comparison circuit CMP, and the analog voltage VLPF formed by the low pass filter circuit LPF is provided to a positive input terminal (+) of the analog comparison circuit CMP. The analog comparison circuit CMP compares a voltage provided to the negative input terminal (−) and a voltage provided to the positive input terminal (+) with each other to output a signal depending on a comparison result as a monitor signal MON. That is, the analog comparison circuit CMP compares the reference voltage VREF and the analog voltage VLPF depending on a phase interval between clock signals adjacent to each other to output a comparison result as the monitor signal MON. Thus, the phase interval detection circuit PDD described in FIG. 1 can be configured by the analog circuit.

Second Embodiment

Figure 7:
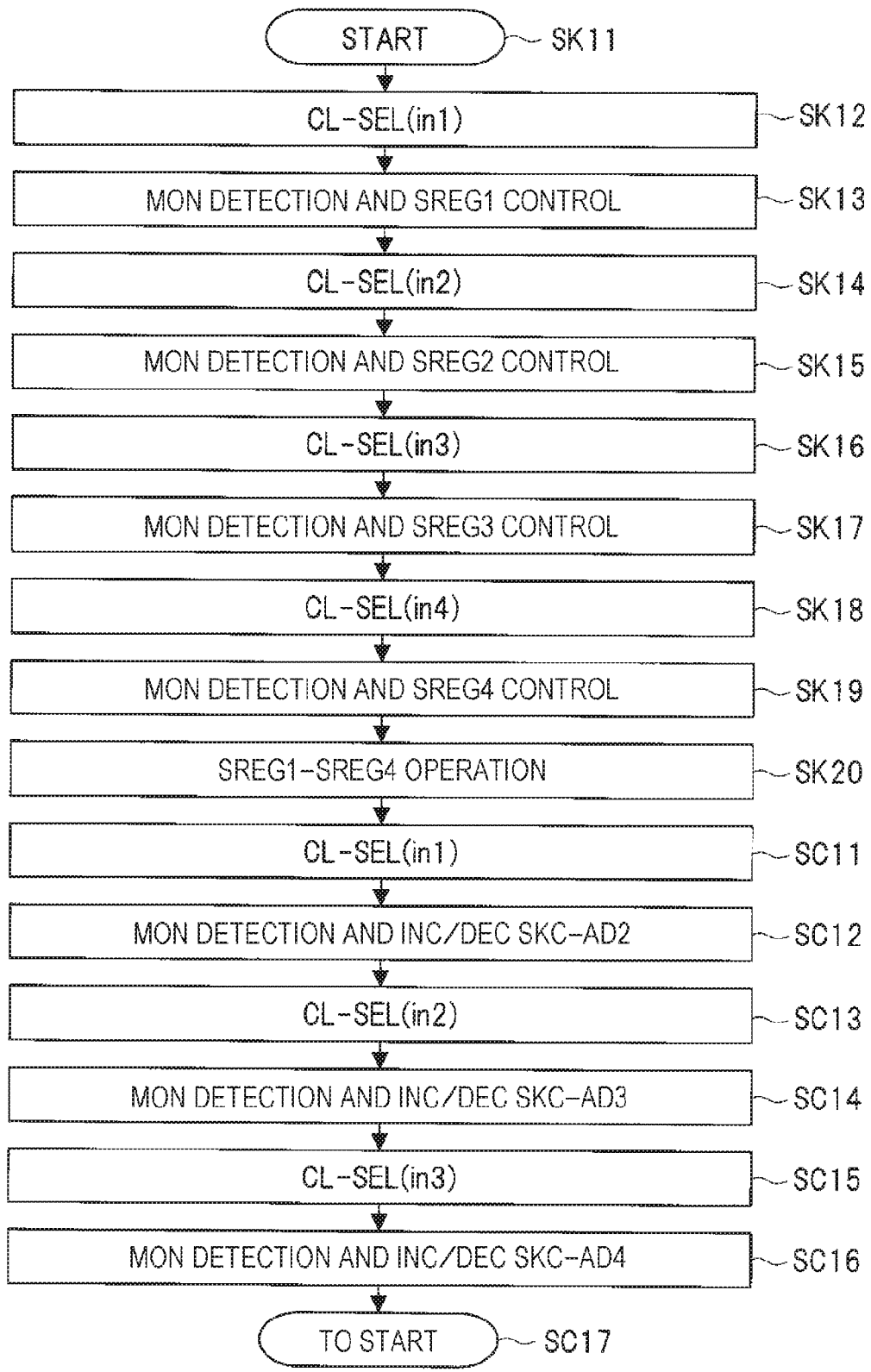
FIG. 7 is a flowchart diagram illustrating operation of a skew adjustment circuit according to a second embodiment.

FIG. 7 is a flowchart diagram illustrating operation of the skew adjustment circuit SKC according to a second embodiment. In the first embodiment, as described in FIG. 4, the operation has been performed in which the reference value of the phase interval is obtained in the calibration period, and the phase interval is adjusted between the clock signals being close to each other by using the reference value obtained. That is, in the example illustrated in FIG. 4, first, adjustment operation is performed so that the phase interval between the clock signals CL1-AA and CL2-AA being close to each other is matched with the reference value, and the phase interval between the clock signals CL1-AA and CL2-AA is adjusted to be matched with the reference value, and then the phase interval between the clock signals CL2-AA whose phase is adjusted to the clock signal CL1-AA and the clock signal CL3-AA is adjusted to be matched with the reference value. In addition, after the phase interval between the clock signals CL2-AA and the clock signal CL3-AA is adjusted to be matched with the reference value, the phase interval between the clock signals CL3-AA whose phase is adjusted to the clock signal CL2 and the clock signal CL4-AA is adjusted to be matched with the reference value.

On the contrary, in the second embodiment, skew calibration operation is performed so that each of the phase intervals between the clock signals being close to each other gradually approaches the reference value.

In FIG. 7, step SK11 illustrates a start of skew calibration (START). In FIG. 7, steps SK12-SK20 correspond to steps SK02-SK10 illustrated in FIG. 4.

That is, in step SK12, the input terminal (in1) of each of the selectors SEL1, SEL2 is selected (CL-SEL (in1)). In step SK13, the delay adjustment signal DL-AD is changed until the logical value of the monitor signal MON is changed, and the delay adjustment signal DL-AD of when the logical value of the monitor signal MON is changed is stored in the skew register SREG1 (MON detection and SREG1 control).

In addition, in step SK14, the input terminal (in2) of each of the selectors SEL1, SEL2 is selected (CL-SEL (in2)). In step SK15, the delay adjustment signal DL-AD is changed until the logical value of the monitor signal MON is changed, and the delay adjustment signal DL-AD of when the logical value of the monitor signal MON is changed is stored in the skew register SREG2 (MON detection and SREG2 control).

Further, in step SK16, the input terminal (in3) of each of the selectors SEL1, SEL2 is selected (CL-SEL (in3)). In step SK17, the delay adjustment signal DL-AD is changed until the logical value of the monitor signal MON is changed, and the delay adjustment signal DL-AD of when the logical value of the monitor signal MON is changed is stored in the skew register SREG3 (MON detection and SREG3 control). In step SK18, the input terminal (in4) of each of the selectors SEL1, SEL2 is selected (CL-SEL (in4)). In step SK19, the delay adjustment signal DL-AD is changed until the logical value of the monitor signal MON is changed, and the delay adjustment signal DL-AD of when the logical value of the monitor signal MON is changed is stored in the skew register SREG4 (MON detection and SREG4 control). Next, in step SK20, a total of values stored in the skew registers SREG1-SREG4, that is, values of phase intervals is obtained, and the total obtained is divided by the number of phases (four phases), and the reference value of the phase interval is obtained (SREG1-SREG4 operation).

Also in the second embodiment, in steps SC11-SC16 performed after step SK20, the phase interval adjustment operation is performed. Before the phase interval adjustment operation is performed, the reference value obtained in step SK20 is stored in, for example, the skew register SREG1, and the delay adjustment signal DL-AD corresponding to the reference value is provided to the reference delay generation circuit RDLG from the skew register SREG1.

In the phase interval adjustment operation, first, in step SC11, the input terminal (in1) of each of the selectors SEL1, SEL2 is selected (CL-SEL (in1)). Next, in step SC12, the phase comparison circuit PDT (FIG. 2) compares the clock signal CL2-AA from the selector SEL1 and the clock signal CL1-AA delayed from the reference delay generation circuit RDLG with each other, to output the monitor signal MON (MON detection). The calibration control unit PDD-CT (FIG. 2), depending on the value of the monitor signal MON, increases (INC) or decreases (DEC) the value of the adjustment register PREG1 (INC/DEC SKC-AD2). Thus, the delay time of the buffer circuit RCF2 is updated so that the phase interval between the clock signals CL1-AA and CL2-AA approaches the reference value.

Next, in step SC13, the input terminal (in2) of each of the selectors SEL1, SEL2 is selected (CL-SEL (in2)). In step SC14, the phase comparison circuit PDT (FIG. 2) compares the clock signal CL3-AA from the selector SEL1 and the clock signal CL2-AA delayed from the reference delay generation circuit RDLG with each other, to output the monitor signal MON (MON detection). The calibration control unit PDD-CT (FIG. 2), depending on the value of the monitor signal MON, increases (INC) or decreases (DEC) the value of the adjustment register PREG2 (INC/DEC SKC-AD3). Thus, the delay time of the buffer circuit RCF3 is updated so that the phase interval between the clock signals CL2-AA and CL3-AA approaches the reference value.

Further, in step SC15, the input terminal (in3) of each of the selectors SEL1, SEL2 is selected (CL-SEL (in3)). In step SC16, the phase comparison circuit PDT (FIG. 2) compares the clock signal CL4-AA from the selector SEL1 and the clock signal CL3-AA delayed from the reference delay generation circuit RDLG, to output the monitor signal MON (MON detection). The calibration control unit PDD-CT (FIG. 2), depending on the value of the monitor signal MON, increases (INC) or decreases (DEC) the value of the adjustment register PREG3 (INC/DEC SKC-AD4). Thus, the delay time of the buffer circuit RCF4 is updated so that the phase interval between the clock signals CL3-AA and CL4-AA approaches the reference value.

After step SC16, step SC17 is executed. By executing step SC17, the operation returns to step SK11 (to START). Thus, by repeating steps SK12-SC16, the phase interval between the clock signals CL1-AA and CL2-AA, the phase interval between the clock signals CL2-AA and CL3-AA, and phase interval between the clock signals CL3-AA and CL4-AA gradually approach the reference value to be matched with the reference value.

In the first embodiment, the skew calibration period is provided separately from the clock data recovery period for recovering the data and clock, and the calibration operation and the phase interval adjustment operation are executed in the skew calibration period. On the contrary, in the second embodiment, the calibration operation and the phase interval adjustment operation can be executed in the clock data recovery period. In the first embodiment, each of the phase intervals of the clock signals CL1-AA-CL4-AA provided to the flip flop circuits FF1-FF4 is matched with the reference value, and then the clock data recovery is performed by taking in the data to those flip flop circuits FF1-FF4. On the contrary, in the second embodiment, in the period of executing the clock data recovery, the phase intervals between the clock signals CL1-AA-CL4-AA provided to the flip flop circuits FF1-FF4 gradually approaches the reference value to be matched with the reference value. Therefore, the phase interval between the clock signals can be matched with a desired value (reference value) in the period of executing the clock data recovery.

For example, when the clock signal CL1-AA is a first phase clock signal, the clock signal CL2-AA is a second phase clock signal, and the clock signal CL3-AA is a third phase clock signal, in the first embodiment, control is performed so that a phase interval between the first phase clock signal and the second phase clock signal is matched with the reference value, and then a phase interval between the second phase clock signal and the third phase clock signal is matched with the reference value. On the contrary, in the second embodiment, control is performed so that comparison between the reference value and a time difference between the first phase clock signal and the second phase clock signal, and comparison between the reference value and a time difference between the second phase clock signal and the third phase clock signal, are repeatedly performed, and the time difference between the first phase clock signal and the second phase clock signal and the time difference between the second phase clock signal and the third phase clock signal approach the reference value at each time of the comparison.

In FIG. 7, it has been described that the operation returns to step SK11 by executing step SC17; however, it is not limited thereto. For example, the operation may return to step SC11 by executing step SC17. In that case, the reference value of the phase interval obtained by steps SK11-SK20 is used in steps SC11-SC16 to be repeatedly executed.

The skew calibration described in the first embodiment and the second embodiment is executed by, for example, a semiconductor device manufacturer providing to users the semiconductor devices BPSC1-BPSCn (FIG. 8) before the semiconductor device manufacturer provides the semiconductor devices. In that case, values for matching the reference value are stored in the adjustment registers PREG1-PREG3 to be provided.

Of course, an executer of the skew calibration is not limited to the semiconductor device manufacturer, and the user to which the semiconductor device is provided can execute the skew calibration. In that case, according to the second embodiment, skew calibration can be executed in the clock data recovery period. In addition, when the user executes the skew calibration, the skew calibration can be executed at predetermined intervals, and also can be executed at any timing, for example, timing when the environment is changed.

When the flowcharts illustrated in FIG. 4 and FIG. 7 are regarded as representing skew calibration methods, steps SK02-SK09 (SK12-SK19) can be regarded as a phase interval detection process for obtaining a time difference (phase interval) between clock signals being close to each other. In that case, step SK10 (SK20) can be regarded as an operation process for obtaining a total of the time difference (phase interval) obtained, dividing the total by the number of phases, and obtaining the reference value of the phase interval. In addition, steps SC01-SC06 (SC11-SC16) can be regarded as a phase interval adjustment process for matching the phase interval between the clock signals with the reference value.

As described above, although the invention made by the present inventor has been specifically described based on the embodiments, the present invention is not limited to the embodiments and can be variously modified without departing from the gist thereof.

What is claimed is:

1. A skew adjustment circuit comprising:
   a plurality of latch circuits for taking in an input signal in response to a plurality of first clock signals;
   a phase adjustment circuit for adjusting phases of a plurality of second clock signals, based on the plurality of second clock signals generated based on a reference clock signal and output signals from the plurality of latch circuits;
   a phase interval detection circuit for detecting a phase interval between the plurality of first clock signals, based on a reference value; and
   a phase interval adjustment circuit for performing adjustment such that phase intervals become equal to each other between the plurality of second clock signals adjusted by the phase adjustment circuit, based on a skew adjustment signal from the phase interval detection circuit, wherein
   the reference value in the phase interval detection circuit is obtained by calibration, and the plurality of second clock signals adjusted by the phase interval adjustment circuit is provided as the plurality of first clock signals to the plurality of latch circuits.

2. The skew adjustment circuit according to claim 1, wherein
   the skew adjustment circuit comprises a reference clock signal formation circuit for forming the reference clock signal, and a PLL circuit for forming the plurality of second clock signals having different phases from each other from the reference clock signal.

3. The skew adjustment circuit according to claim 2, wherein
   the calibration obtains a time difference between the first clock signals being close to each other in the plurality of first clock signals, and divides a total of the obtained time difference by the number of the second clock signals to obtain a value to be the reference value.

4. The skew adjustment circuit according to claim 3, wherein
   the number of the plurality of second clock signals is four.

5. A semiconductor device comprising:
   a clock data recovery circuit including a plurality of latch circuits for taking in an input signal in response to a plurality of first clock signals having different phases from each other, and for receiving output signals from the plurality of latch circuits to form a plurality of second clock signals having different phases from each other from the output signals received;
   a phase interval detection circuit for detecting a phase interval between the plurality of first clock signals, based on a reference value; and
   a phase interval adjustment circuit for performing adjustment such that phase intervals become equal to each other between the plurality of second clock signals formed by the clock data recovery circuit, based on a skew adjustment signal from the phase interval detection circuit, wherein
   the reference value is obtained by calibration, and the plurality of second clock signals adjusted by the phase interval adjustment circuit is provided to the plurality of latch circuits as the plurality of first clock signals.

6. The semiconductor device according to claim 5, wherein
   the clock data recovery circuit includes a PLL circuit for forming the plurality of second clock signals based on a reference clock signal,
   the calibration obtains a time difference between the first clock signals being close to each other and divides a total of the obtained time difference by the number of the plurality of second clock signals to obtain a value to be the reference value, and
   the phase interval detection circuit provides a signal corresponding to a difference between the reference value and a phase difference between the second clock signals being close to each other, as the skew adjustment signal, to the phase interval adjustment circuit.

7. The semiconductor device according to claim 6, wherein
   the plurality of latch circuits takes in the input signal synchronizing with the rise of the plurality of first clock signals, the phase interval adjustment circuit performs adjustment such that the rises become equal to each other between the plurality of second clock signals, and the number of the plurality of second clock signals is four.

8. A skew calibration method for correcting a skew between a plurality of clock signals having different phases from each other,
   the skew calibration method comprising:
   a phase interval detection process for obtaining a time difference between the clock signals being close to each other, in the plurality of clock signals formed based on a reference clock signal; and
   an operation process for obtaining a total of the time difference obtained in the phase interval detection process for the plurality of clock signals and obtaining a reference value by dividing the obtained total by the number of the plurality of clock signals, wherein.
   phases of the clock signals are corrected by the reference value obtained in the operation process.

9. The skew calibration method according to claim 8, wherein
   the plurality of clock signals includes a first phase clock signal, a second phase clock signal being close to the first phase clock signal, and a third phase clock signal being close to the second phase clock signal, and a time difference between the first phase clock signal and the second phase clock signal is adjusted to be matched with the reference value, and then a time difference between the adjusted second phase clock signal and the third phase clock signal is adjusted to be matched with the reference value.

10. The skew calibration method according to claim 8, wherein the plurality of clock signals includes a first phase clock signal, a second phase clock signal being close to the first phase clock signal, and a third phase clock signal being close to the second phase clock signal, and a comparison between the reference value and a time difference between the first phase clock signal and the second phase clock signal, and a comparison between the reference value and a time difference between the second phase clock signal and the third phase clock signal, are repeatedly performed, and, for each time of the comparison, the time difference between the first phase clock signal and the second phase clock signal, and the time difference between the second phase clock signal and the third phase clock signal approach the reference value.

\* \* \* \* \*